United States Patent
Barr et al.

(10) Patent No.: US 9,553,268 B2
(45) Date of Patent: Jan. 24, 2017

(54) CATHODE BUFFER MATERIALS AND RELATED DEVICES AND METHODS

(71) Applicants: Massachusetts Institute of Technology, Cambridge, MA (US); Eni S.p.A., Rome (IT)

(72) Inventors: Miles C. Barr, Cambridge, MA (US); Karen K. Gleason, Cambridge, MA (US); Chiara Carbonera, Trecate (IT); Riccardo Po, Novara (IT); Vladimir Bulovic, Lexington, MA (US)

(73) Assignees: Massachusetts Institute of Technology, Cambridge, MA (US); Eni S.p.A., Rome (IT)

(*) Notice: Subject to any disclaimer, the term of this patent is extended or adjusted under 35 U.S.C. 154(b) by 0 days.

(21) Appl. No.: 14/378,564

(22) PCT Filed: Feb. 13, 2013

(86) PCT No.: PCT/US2013/025935
§ 371 (c)(1),
(2) Date: Aug. 13, 2014

(87) PCT Pub. No.: WO2013/123046
PCT Pub. Date: Aug. 22, 2013

(65) Prior Publication Data
US 2015/0044804 A1    Feb. 12, 2015

Related U.S. Application Data

(60) Provisional application No. 61/598,325, filed on Feb. 13, 2012.

(51) Int. Cl.
*H01L 51/00* (2006.01)
*C08G 61/12* (2006.01)
(Continued)

(52) U.S. Cl.
CPC ........... *H01L 51/0021* (2013.01); *B82Y 10/00* (2013.01); *C08G 61/126* (2013.01); *H01B 1/127* (2013.01);
(Continued)

(58) Field of Classification Search
CPC .................................................. H01L 51/0021
See application file for complete search history.

(56) References Cited

U.S. PATENT DOCUMENTS 7,618,680 B2    11/2009   Gleason et al.
9,136,488 B2    9/2015    Park et al.
(Continued)

FOREIGN PATENT DOCUMENTS

WO    WO 2011/041407    4/2011
WO    WO 2011/056778    5/2011
(Continued)

OTHER PUBLICATIONS

Rider, David "Stable Inverted Polymer/Fullerene Solar Cells Using a Cationic Polythiophene Modified PEDOT:PSS Cathodic Interface" Adv. Funct. Mater. Aug. 9, 2010, vol. 20 pp. 2404-2415).*
(Continued)

*Primary Examiner* — Matthew Landau
*Assistant Examiner* — Grant Withers
(74) *Attorney, Agent, or Firm* — Wolf, Greenfield & Sacks, P.C.

(57) ABSTRACT

The present invention generally relates to cathode buffer materials and devices and methods comprising the cathode buffer materials.

10 Claims, 8 Drawing Sheets

(51) Int. Cl.

| | |
|---|---|
| *H01L 51/44* | (2006.01) |
| *H01B 1/12* | (2006.01) |
| *B82Y 10/00* | (2011.01) |
| *H01L 51/56* | (2006.01) |
| *H01L 51/42* | (2006.01) |

(52) U.S. Cl.
CPC .......... *H01L 51/0037* (2013.01); *H01L 51/44* (2013.01); *H01L 51/441* (2013.01); *H01L 51/56* (2013.01); *C08G 2261/3223* (2013.01); *C08G 2261/3247* (2013.01); *C08G 2261/70* (2013.01); *C08G 2261/91* (2013.01); *C08G 2261/95* (2013.01); *H01L 51/0046* (2013.01); *H01L 51/0056* (2013.01); *H01L 51/424* (2013.01); *H01L 2251/308* (2013.01); *Y02E 10/549* (2013.01)

(56) References Cited

U.S. PATENT DOCUMENTS

| | | | |
|---|---|---|---|
| 2004/0102577 A1* | 5/2004 | Hsu et al. | 525/182 |
| 2004/0127637 A1* | 7/2004 | Hsu et al. | 524/800 |
| 2004/0256980 A1* | 12/2004 | Tsuchiya | 313/503 |
| 2005/0074629 A1 | 4/2005 | Forrest et al. | |
| 2006/0269664 A1 | 11/2006 | Gleason et al. | |
| 2010/0089452 A1 | 4/2010 | Suzuki et al. | |
| 2010/0187513 A1* | 7/2010 | Okumoto | 257/40 |
| 2010/0255303 A1 | 10/2010 | Wardle et al. | |
| 2011/0012091 A1 | 1/2011 | Forrest et al. | |
| 2011/0139252 A1 | 6/2011 | Chen et al. | |
| 2011/0301677 A1 | 12/2011 | Hendricks et al. | |
| 2012/0080086 A1 | 4/2012 | Yoon et al. | |
| 2012/0097238 A1 | 4/2012 | Isaacs-Sodeye | |
| 2013/0015424 A1 | 1/2013 | Chung et al. | |
| 2013/0161596 A1 | 6/2013 | Huang et al. | |
| 2013/0320302 A1* | 12/2013 | Park et al. | 257/14 |
| 2014/0183736 A1* | 7/2014 | Cox et al. | 257/741 |
| 2014/0261658 A1* | 9/2014 | Lin et al. | 136/256 |
| 2015/0027529 A1 | 1/2015 | Barr et al. | |
| 2015/0072446 A1* | 3/2015 | Worfolk et al. | 438/10 |

FOREIGN PATENT DOCUMENTS

| | | |
|---|---|---|
| WO | WO 2011/141706 | 11/2011 |
| WO | WO 2011/163556 | 12/2011 |
| WO | WO 2013/123039 | 8/2013 |
| WO | WO 2013/123046 | 8/2013 |

OTHER PUBLICATIONS

Zhang et al. ("Zhang" Zhang, F. "Recent development of the inverted configuration organic solar cells" Solar Energy Mat. & Sol. Cells vol. 95, Iss. 7 Jul. 2011 pp. 1785-1799).*
Salanek et al. ("Salanek" Salaneck, W. "Conjugated Polymer and Molecular Interfaces: Science and Technology for Photonic and Optoelectronic Applications" copyright 2002 Chapter 23, p. 787).*
International Preliminary Report on Patentability mailed Aug. 28, 2014 for Application No. PCT/US2013/025923.
International Preliminary Report on Patentability mailed Aug. 28, 2014 for Application No. PCT/US2013/025935.
International Search Report and Written Opinion mailed Oct. 16, 2013 for Application No. PCT/US2013/043050.
International Preliminary Report on Patentability mailed Dec. 11, 2014 for Application No. PCT/US2013/043050.
Invitation to Pay Additional Fees mailed Apr. 23, 2013 for Application No. PCT/US2013/025935.
[No author listed], Heliatek achieves new world record for organic solar cells with certified 9.8 % cell efficiency. Heliatek press release. 2011. Accessed online Mar. 19, 2015 at heliatek.com/?p=1346 &lang=en.
Ajuria et al., Inverted ITO-free organic solar cells based on p and n semiconducting oxides. New designs for integration in tandem cells, top or bottom detecting devices, and photovoltaic windows. Energy and Environ Sci. 2011;4:453-8.
Alf et al., Chemical vapor deposition of conformal, functional, and responsive polymer films. Adv Mater. May 11, 2010;22(18):1993-2027.
Bae et al., Roll-to-roll production of 30-inch graphene films for transparent electrodes. Nat Nanotechnol. Aug. 2010;5(8):574-8. Epub Jun. 20, 2010.
Barr et al., Direct Monolithic Integration of Organic Photovoltaic Circuits on Unmodified Paper. Advanced Materials 2011, 23, (31), 3500-3505.
Baxamusa et al., Initiated and oxidative chemical vapor deposition: a scalable method for conformal and functional polymer films on real substrates. Phys Chem Chem Phys. Jul. 14, 2009;11(26):5227-40. Epub Mar. 26, 2009.
Brabec et al., Polymer—Fullerene Bulk-Heterojunction Solar Cells. Adv Mater. 2010;22(34):3839-56.
Brown et al., Improved current extraction from ZnO/PbS quantum dot heterojunction photovoltaics using a MoO3 interfacial layer. Nano Lett. Jul. 13, 2011;11(7):2955-61. doi: 10.1021/nl201472u. Epub Jun. 10, 2011.
Chen et al., Flexible Polymer Photovoltaic Devices Prepared With Inverted Structures on Metal Foils. Ieee Electron Device Lett. 2009;30(7):727-9.
Chen et al., Recent Progress in Polymer Solar Cells: Manipulation of Polymer:Fullerene Morphology and the Formation of Efficient Inverted Polymer Solar Cells. Adv Mater. 2009;14-15:1434-1449.
Forrest, The path to ubiquitous and low-cost organic electronic appliances on plastic. Nature. Apr. 29, 2004;428(6986):911-8.
Fujishima et al., Organic thin-filmsolarcellemployinganovelelectron-donormaterial. Solar Energy Materials and Solar Cells 2009, 93, (6-7), 1029-1032.
Glatthaar et al., Organic solar cells using inverted layer sequence. Thin Solid Films 2005;491:298-300.
Gunes et al., Conjugated polymer-based organic solar cells. Chem Rev. Apr. 2007;107(4):1324-38.
Hancox et al., Increased efficiency of small molecule photovoltaic cells by insertion of a MoO3 hole-extracting layer. Energy and Environ Sci. 2010;3:107-110.
Hau et al., A Review on the Development of the Inverted Polymer Solar Cell Architecture. Polymer Reviews. 2010;50(4):474-510.
Hsiao et al., All-solution-processed inverted polymer solar cells on granular surface-nickelized polyimide. Org Electron. 2009;10(4):551-61.
Huang et al., Investigation of the Effects of Doping and Post-Deposition Treatments on the Conductivity, Morphology, and Work Function of Poly(3,4-ethylenedioxythiophene)/Poly(styrene sulfonate) Films. Adv Func Mater. 2005;15(2):290-6.
Hubler et al., Printed paper photovoltaic cells. Adv Energy Mater. 2011;1:1018-1022.
Im et al., Doping level and work function control in oxidative chemical vapor deposited poly (3,4-ethylenedioxythiophene). Applied Physics Letters. 2007, 90, (15), 152112.
Im et al., Systematic Control of the Electrical Conductivity of Poly(3,4-ethylenedioxythiophene) via Oxidative Chemical Vapor Deposition. Macromol. 2007;40(18):6652-6.
Jakobsson et al., Towards all-plastic flexible light emitting diodes. Chem Phys Lett. 2006;433:110-114.
Kim et al., Highly Conductive PEDOT:PSS Electrode with Optimized Solvent and Thermal Post-Treatment for ITO-Free Organic Solar Cells. Adv Func Mater. 2011;21(6):1076-81.
Kim et al., Kelvin probe and ultraviolet photoemission measurements of indium tin oxide work function: a comparison. Synth Met. 2000;111:311-4.
Kim et al., The effect of molybdenum oxide interlayer on organic photovoltaic cells. Appl Phys Lett. 2009;95:093304.
Kinoshita et al., Independent control of open-circuit voltage of organic solar cells by changing film thickness of MoO 3 buffer layer. Appl Phys Lett. 2008;92:243309.

(56) References Cited

OTHER PUBLICATIONS

Kirchmeyer et al., Scientific importance, properties and growing applications of poly(3,4-ethylenedioxythiophene). J Mater Chem. 2005;15:2077-88.
Lamprecht et al., Organic photodiodes on newspaper. Physica status solidi (a). 2005;202(5):R50-52.
Li et al., An inverted polymer photovoltaic cell with increased air stability obtained by employing novel hole/electron collecting layers. J Mater Chem. 2009;19(11):1643-7.
Li et al., Efficient inverted polymer solar cells. Appl Phys Lett. 2006;88:253503.
Li et al., Large-area synthesis of high-quality and uniform graphene films on copper foils. Science. Jun. 5, 2009;324(5932):1312-4. Epub May 7, 2009.
Li et al., Open circuit voltage enhancement due to reduced dark current in small molecule photovoltaic cells. Appl Phys Lett. 2009;94(2):023307.
Liao et al., Highly efficient inverted polymer solar cell by low temperature annealing of Cs 2 CO 3 interlayer. Appl Phys Lett. 2008;92:173303.
Lindell et al., Transparent, Plastic, Low-Work-Function Poly(3,4-ethylenedioxythiophene) Electrodes. Chem Mater. 2006;18(18):4246-52.
Lunt et al., Transparent, near-infrared organic photovoltaic solar cells for window and energy-scavenging applications. Appl Phys Lett. 2011;98:113305.
McCullough, The Chemistry of Conducting Polythiophenes. Adv Mater. 1998;10(2):93-116.
Meiss et al., Improved light harvesting in tin-doped indum oxide (ITO)-free inverted bulk-heterojunction organic solar cells using capping layers. Appl Phys Lett. 2008;93:103311.
Meyer et al., Effect of contamination on the electronic structure and hole-injection properties of MoO3/organic semiconductor interfaces. Appl Phys Lett. 2010;96:133308.
Milliron et al., Surface oxidation activates indium tin oxide for hole injection. Journal of Applied Physics. Jan. 1, 2000, 87, (1), 572-576.
Murakami et al., Surface modification of polystyrene and poly(methyl methacrylate) by active oxygen treatment. Colloids and Surfaces B: Biointerfaces. 2003, 29, (2-3), 171-179.
Na et al., Efficient and Flexible ITO-Free Organic Solar Cells Using Highly Conductive Polymer Anodes. Adv Mater. 2008;20(21):4061-4067.
Nickel et al., Cathodes comprising highly conductive poly(3,4-ethylenedioxythiophene):poly(styrenesulfonate) for semi-transparent polymer solar cells. Org Electron. 2010;11(4):535-8.
Nyholm et al., Toward Flexible Polymer and Paper-Based Energy Storage Devices. Adv Mater. 2011;23(33):3751-69.
Osikowicz et al., Transparent low-work-function indium tin oxide electrode obtainedby molecular scale interface engineering. Appl Phys Lett. 2004;85:1616.
Park et al., Doped graphene electrodes for organic solar cells. Nanotechnology. Dec. 17, 2010;21(50):505204. Epub Nov. 23, 2010.
Park et al., Graphene as transparent conducting electrodes in organic photovoltaics: studies in graphene morphology, hole transporting layers, and counter electrodes. Nano Lett. Jan. 11, 2012;12(1):133-40. Epub Dec. 1, 2011.
Park et al., Organic solar cells with graphene electrodes and vapor printed poly(3,4-ethylenedioxythiophene) as the hole transporting layers. ACS Nano. Jul. 24, 2012;6(7):6370-7. Epub Jun. 28, 2012.
Park et al., Work function of indium tin oxide transparent conductor measured by photoelectron spectroscopy. Applied Physics Letters 1996, 68, (19), 2699-2701.
Parthasarathy et al., A metal-free cathode for organic semiconductor devices. Appl Phys Lett. 1998;72:2138.
Pettersson et al., Modeling photocurrent action spectra of photovoltaic devices based on organic thin films. J Appl Phys. 1999;86:487.
Peumans et al., Small molecular weight organic thin-film photodetectors and solar cells. J Appl Phys. 2003;93(7):3693-3723.
Peumans et al., Very-high-efficiency double-heterostructure copper phthalocyanine/ C 60 photovoltaic cells Applied Physics Letters. 2001, 79, (1),126-128.
Pfuetzner et al., Thick C 60 :ZnPc bulk heterojunction solar cells with improved performance by film deposition on heated substrates. Appl Phys Lett. 2009;94:253303.
Po et al., The role of buffer layers in polymer solar cells. Energy Environ Sci. 2011;4:285-310.
Reina et al., Large area, few-layer graphene films on arbitrary substrates by chemical vapor deposition. Nano Lett. Jan. 2009;9(1):30-5.
Rider et al., Stable Inverted Polymer/Fullerene Solar Cells Using a Cationic Polythiophene Modified PEDOT:PSS Cathodic Interface. Adv Funct Mater. 2010;20(15):2404-2415.
Shrotriya et al., Transition metal oxides as the buffer layer for polymer photovoltaic cells . Appl Phys Lett. 2006;88:0703508.
Siegel et al., Foldable Printed Circuit Boards on Paper Substrates. Adv Mater. 2010;20(1)28-35.
Song et al., Degradation of small-molecule organic solar cells. Appl Phys Lett. 2006;89:251118.
Sun et al., Efficient, Air-Stable Bulk Heterojunction Polymer Solar Cells Using MoOx as the Anode Interfacial Layer. Adv Mater. 2011;23(19):2226-30.
Tao et al., Highly efficient polycarbazole-based organic photovoltaic devices. Appl Phys Lett. 2009;95:063304.
Tao et al., Performance improvement of inverted polymer solar cells with different top electrodes by introducing a MoO3 bufferlayer. Appl Phys Lett. 2008;93(19):193307.
Tenhaeff et al., Initiated and Oxidative Chemical Vapor Deposition of Polymeric Thin Films: iCVD and oCVD. Adv Funct Mater. 2008;18:979-992.
Tobjork et al., Paper Electronics. Adv Mater. 2011;23(17):1935-61.
Tong et al., Inverted organic photovoltaic cells with high open-circuit voltage. Organic Electronics. 2010;11:705-9.
Waldauf et al., Highly efficient inverted organic photovoltaics using solution based titanium oxide as electron selective contact. Appl Phys Lett. 2006;89:233517.
Wan et al., Graphene—a promising material for organic photovoltaic cells. Adv Mater. Dec. 1, 2011;23(45):5342-58. Epub Sep. 29, 2011.
Wang et al., Interface engineering of layer-by-layer stacked graphene anodes for high performance organic solar cells. Adv Mater. Apr. 5, 2011;23(13):1514-8. Epub Jan. 28, 2011.
Wang et al., Large area, continuous, few-layered graphene as anodes in organic photovoltaic devices. Applied Physics Letters 2009, 95, (6), 063302.
Wang et al., Papery solar cells based on dielectric/metal hybrid transparent cathode. Sol Energy Mater and Sol Cells. 2010;94(7):1270-4.
Winther-Jensen et al., High-conductivity large-area semi-transparent electrodes for polymer photovoltaics by silk screen printing and vapour-phase deposition. 2006;90(2):123-132.
Zhang et al., Inverted small molecule organic solar cells with Ca modified ITO as cathode and MoO3 modified Ag as anode. Sol Energy Mater Sol Cells. 2010;94(12):2416-21.
Zschieschang et al., Organic Electronics on Banknotes. Adv Mater. 2010;23(5):654-8.
International Search Report and Written Opinion dated May 27, 2013 for Application No. PCT/US2013/025923.
International Search Report and Written Opinion mailed Dec. 16, 2013 for Application No. PCT/US2013/025935.
Admassie et al., A polymer photodiode using vapour-phase polymerized PEDOT as an anode. Solar Energy Materials and Solar Cells. Jan. 23, 2006;90(2):133-41.
Baierl et al., Efficient indium-tin-oxide (ITO) free top-absorbing organic phtodetector with highly transparent polymer top electrode. Organics Electronics. Jun. 21, 2011;12(10):1669-73.
Borrelli et al., Bilayer heterojunction polymer solar cells using unsubstituted polythiophene via oxidative chemical vapor deposition. Solar Energy Materials and Solar Cells. Dec. 26, 2011;99:1906.
Gadisa et al., Transparent polymer cathode for organic photovoltaic devices. Synthetic Metals. 2006;156:1102-7.

(56) References Cited

OTHER PUBLICATIONS

Hau et al., Indium tin oxide-free semi-transparent inverted polymer solar cells using conducting polymer as both bottom and top electrodes. Organic Electronics. 2009;10:1401-7.

Kuwabara et al., Highly durable inverted-type organic solar cell using amorphous titanium oxide as electron collection electrode inserted between ITO and organic layer. Solar Energy Materials and Solar Cells. Jul. 25, 2008;92(11):1476-82.

Lock et al., Oxidative Chemical Vapor Deposition of Electrically Conducting Poly(3,4-ethylenedioxythiophene) Films. Macromolecules. Jul. 14, 2006;39(16):5326-9.

Wang et al., High-performance metal-free solar cells using stamp transfer printed vapor phase polymerized poly(3,4-ethylenedioxythiophene) top anodes. Adv Funct Mater. Feb. 2, 2012;22(7):1454-60.

\* cited by examiner

CATHODE BUFFER MATERIALS AND RELATED DEVICES AND METHODS

RELATED APPLICATIONS

The present application is a national stage filing under 35 under U.S.C. §371 of International PCT Application No. PCT/US2013/025935, filed Feb. 13, 2013, entitled "CATHODE BUFFER MATERIALS AND REALTED DEVICES AND METHODS," by Barr et al., which claims priority to U.S. Provisional Application Ser. No. 61/598,325, filed Feb. 13, 2012, entitled "CATHODE BUFFER MATERIALS AND RELATED DEVICES AND METHODS," by Barr et al., each of which are incorporated herein by reference.

FIELD OF THE INVENTION

The present invention generally relates to cathode buffer materials and devices and methods comprising the cathode buffer materials.

BACKGROUND OF THE INVENTION

Organic photovoltaic cells (OPVs) have received significant interest for their potential as a low-cost energy source and efficiencies have recently reached records nearing 10% using both solution and vacuum deposition methods. In the conventional orientation for organic photovoltaic cells, the OPV is illuminated through a transparent hole-collecting anode deposited on the substrate, (e.g. indium tin oxide (ITO)), and electrons are collected by a low work function metal cathode top contact. Development of efficient inverted device structures (e.g., wherein electrons are collected by a transparent cathode) (i) may provide more degrees of freedom in designing OPV fabrication schemes, including tandem and semitransparent devices, (ii) may allow for protection of the delicate organic semiconductor layers below metal oxide anode buffer layers prior to subsequent top layer deposition steps, and/or (iii) may have improved stable by allowing use of higher work function metal top contacts and/or protection of air-sensitive electron acceptor layer. However, due to the high work function of common transparent conductors (e.g. ITO and conductive polymers) such structures generally require a low work function interfacial cathode buffer layer, which aids in providing sufficient electric field through the device and/or may allow for ohmic contact with the adjacent electron acceptor.

Accordingly, improved cathode buffer materials and related devices and methods are needed.

SUMMARY OF THE INVENTION

In some embodiments, an electromagnetic radiation absorbing and/or emitting device is provided comprising a conductive polymer as a cathode buffer material, wherein the conductive polymer is formed by or formable by oxidative chemical vapor deposition.

In some embodiments, an electromagnetic radiation absorbing and/or emitting device is provided comprising reduced poly(3,4-ethylenedioxythiophene) as a cathode buffer material.

In some embodiments, a method of forming an electromagnetic radiation absorbing and/or emitting device is provided comprising providing a substrate associated with a cathode; and depositing a cathode buffer material on at least a portion of the cathode via oxidative chemical vapor deposition, wherein the cathode buffer material comprises a conductive polymer.

In some embodiments, a method of forming an electromagnetic radiation absorbing and/or emitting device is provided comprising providing a substrate associated with a cathode; depositing a cathode buffer material on at least a portion of the cathode, wherein the cathode buffer material comprises a conductive polymer; and exposing the cathode buffer material to a reducing agent, thereby reducing at least a portion of the conductive polymer.

Figure 1A:
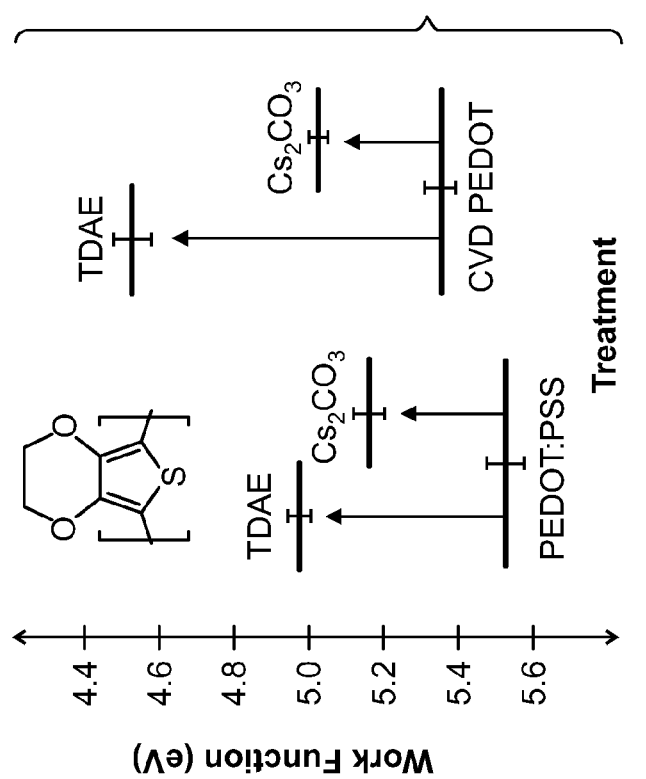
FIG. 1a shows work functions of PEDOT:PSS and CVD PEDOT cathode buffer layers treated with TDAE or $Cs_2CO_3$, respectively, according to some embodiments.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure, nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION

The present invention generally relates to cathode buffer materials and devices and methods comprising the cathode buffer materials. In some cases, the cathode buffer material comprises a conductive polymer, for example, poly(3,4-ethylenedioxythiophene). In some embodiments, the cathode buffer material is formed by oxidative chemical vapor deposition (oCVD).

In some embodiments, the present invention provides electromagnetic radiation absorbing and/or emitting devices comprising a conductive polymer as a cathode buffer material. While many of the embodiments described herein are discussed in relation to photovoltaic cells, this is by no means limiting, and other electromagnetic radiation absorbing and/or emitting devices may be employed.

The term "cathode buffer material" as used herein, is given its ordinary meaning in the art and generally refers to a material which is disposed between a cathode and a photoactive material. Generally, a cathode buffer material aids in reducing the work function of the cathode interface. Those of ordinary skill in the art will be able to select suitable cathode buffer materials with appropriate work functions for use in the methods and devices described herein.

In some embodiments, the transmittance of the cathode buffer material in the ultraviolet-visible range is greater than or equal to about 40%, or about 50%, or about 60%, or about 70%, or about 80%, or about 90%, or about 95%, or about 97, or about 99%. In some instances, the transmittance of the cathode buffer material in the ultraviolet-visible range (e.g. at 560 nm) is between about 40% and about 100%, or between about 50% and about 100%, or between about 60% and about 100%, or between about 70% and about 100%, or between about 80% and about 100%, or between about 90% and about 100%, or between about 95% and about 100%, or between about 97% and about 100%, or between about 99% and about 100%. In some embodiments, the transmittance is determine at a wavelength between about 200 nm and about 2,000 nm, or between about 200 nm and about 1,500 nm, or between about 200 nm and about 1,000 nm, or between about 200 nm and about 800 nm, or between about 300 nm and about 800 nm, or between about 400 nm and about 800 nm, or between about 500 nm and about 800 nm, or between about 500 nm and about 600 nm. In some embodiments, the transmittance is determined at a wavelength of 560 nm. Those of ordinary skill in the art will be aware of methods and systems for determining the transmittance of the cathode buffer material. For example, the transmittance of the cathode buffer material may be determined by using a UV-Vis spectrometer to scan a wavelength range of 200 to 2,000 nm and measure the transmittance at a specific wavelength within that range.

In some embodiments the conductivity of the cathode buffer material is greater than or equal to about 50 S/cm, or about 100 S/cm, or about 200 S/cm, or about 400 S/cm, or about 600 S/cm, or about 800 S/cm, or about 1,000 S/cm, or about 1,200 S/cm, or about 1,400 S/cm, or about 1,600 S/cm, or about 1,800 S/cm. In some instance, the conductivity of the cathode buffer material is between about 50 S/cm to about 2,000 S/cm, or between about 200 to 2,000 S/cm, or between about 400 to about 2,000 S/cm, or between about 600 to 2,000 S/cm, or between about 800 to 2,000 S/cm, or between about 1,000 to 2,000 S/cm, or between about 50 S/cm to about 1,000 S/cm, or between about 200 S/cm to about 1,000 S/cm, or about 400 S/cm to about 1,000 S/cm. Those of ordinary skill in the art will be aware of methods and systems for determining the sheet resistance of the cathode buffer material. For example, the conductivity may be determined by measuring the sheet resistance with a four point probe device and measuring the film thickness by any suitable method.

In some embodiments, the ratio of the optical conductivity to the direct current conductivity ($\sigma_{op}/\sigma_{dc}$) of the cathode buffer material is greater than or equal to about 2, or about 4, or about 6, or about 8, or about 10, or about 12, or about 15, or about 20, or about 25, or about 30, or about 35. In some instances, the ratio of the optical conductivity to the direct current conductivity ($\sigma_{op}/\sigma_{dc}$) of the cathode buffer material is between about 2 and about 40, or between about 4 and about 40, or between about 6 and about 40, or between about 8 and about 40, or between about 12 and about 40, or between about 15 and about 40, or between about 20 and about 40, or between about 25 and about 40. Those of ordinary skill in the art will be aware of methods and systems for determining the ratio of the optical conductivity to the direct current conductivity of the cathode buffer material. For example, the optical conductivity and the direct current conductivity may be determined by fitting experimental data of percent transmittance versus sheet resistance to an equation relating transmittance and sheet resistance as provided herein.

In some embodiments, the sheet resistance ($R_{sh}$) of the cathode buffer material is greater than or equal to about 40 ohms, or about 100 ohms, or about 200 ohms, or about 500 ohms, or about 800 ohms, or about 1,000 ohms, or about 1,500 ohms, or about 1,000 ohms, or about 5,000 ohms, or about 10,000 ohms, or about 15,000 ohms. In some instance, the sheet resistance of the cathode buffer material is between about 40 ohms to about 100 ohms, or between about 40 to 200 ohms, or between about 40 to about 500 ohms, or between about 40 to 800 ohms, or between about 40 to 1,000 ohms, or between about 40 to 1,500 ohms, or between about 40 ohms to about 5,000 ohms, or between about 40 ohms to about 10,000 ohms, or about 40 ohms to about 15,000 ohms. Those of ordinary skill in the art will be aware of methods and systems for determining the sheet resistance of the cathode buffer material. For example, the sheet resistance may be determined using a four point probe device.

In some embodiments, the cathode buffer material is formed by or formable by oCVD. oCVD techniques with be known to those of ordinary skill in the art and are described in the literature, for example, see, M. E. Alf et al., Adv. Mater. 22, 1993 (2010); and S. H. Baxamusa, S. G. Im, K. K. Gleason, Phys. Chem. Chem. Phys. 11, 5227 (2009), each herein incorporated by reference. As will be known to those of ordinary skill in the art, oCVD, is a solvent-free, vacuum-based technique, in which conjugated polymer films are formed directly on the substrate by oxidative polymerization of vapor-phase monomer and oxidant precursors at low temperature (25-150° C.) and under moderate vacuum (~0.1 Torr). Well-defined polymer patterns can be "vapor-printed" on the material of choice when this process is combined with in situ shadow masking. Thus, oCVD offers an attractive solvent-free route to forming cathode buffer materials, while maintaining the benefits of vacuum processing, including parallel and sequential deposition, well-defined thickness control and uniformity, and inline compatibility with standard vacuum process (e.g. thermal evaporation). Moreover, oCVD is conformal over nonplanar substrates, enabling compatibility with substrates such as paper and textiles. In contrast, vacuum thermal evaporation is generally subject to line-of-sight deposition, while conformal deposition of liquid-phase systems is complicated by surface tension effects around micro- and nano-scale features.

In some embodiments, oCVD methods comprise providing a vapor-phase monomer species and a vapor-phase oxidizing agent to produce a vapor comprising a conductive polymer precursor and contacting the vapor with the surface of the cathode to form the conductive polymer on the surface. In some embodiments, due to presence of excess oxidizing agent, a doped or oxidized polymer species may be generated in vapor phase and may form on the surface. In an illustrative embodiment, the method may involve oxidative polymerization of thiophene to a doped form of polythiophene, wherein the polythiophene is in oxidized form and contains polarons and bipolarons. As described herein, following formation of the buffer material on the cathode, the buffer may be further treated, exposed, or associated with a secondary material which may alter the properties of the cathode buffer material. For example, post-deposition treatment of the oxidized polythiophene with a reducing agent such as methanol may produce the reduced form of thiophene. In some cases, the post-deposition treatment may comprise a chemical rinsing step, such as an acid rinsing step. The chemical rinsing step may be used to remove oxidants, perform dopant exchange, change film morphology (e.g., increase crystallinity, decrease roughness), tune the work function, and/or reduce sheet resistance of the cathode buffer material.

In some cases, the cathode buffer material is a conductive polymer, such as a conjugated polymer. The conjugated polymer may be polyacetylene, polyarylene, polyarylene vinylene, or polyarylene ethynylene, any of which are optionally substituted. In some cases, the conjugated polymer is polyphenylene, polythiophene, polypyrrole, polyaniline, or polyacetylene, any of which are optionally substituted. In some embodiments, the conjugated polymer is a copolymer. In one set of embodiments, the polymer is an optionally substituted polythiophene. In a particular embodiment, the conjugated polymer is an unsubstituted polythiophene. In some embodiments, the conjugated polymer is a copolymer of thiophene.

Poly(thiophenes) will be known to those of ordinary skill in the art and generally contain the repeating unit:

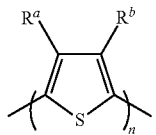

wherein $R^a$ and $R^b$ can be the same or different and each can independently be hydrogen, alkyl, heteroalkyl aryl, heteroaryl, arylalkyl, arylheteroalkyl, heteroarylalkyl, each optionally substituted, or $R^a$ and $R^b$ can be joined to form an optionally substituted ring (e.g., a saturated or unsaturated ring); and n can be any integer between 2 and 100,000,000. In some embodiments, $R^a$ and $R^b$ are hydrogen.

Those of ordinary skill in the art will be able to select the appropriate monomer species for use in a particular application to form the conductive polymer. In some cases, the monomer species is a compound comprising an aryl or heteroaryl group, any of which is optionally substituted. The monomer species may be, for example, an optionally substituted heteroaryl group such as an optionally substituted thiophene. Examples of aryl or heteroaryl groups include, but are not limited to phenyl, naphthyl, tetrahydronaphthyl, indanyl, indenyl, fluorenyl, pyridyl, pyrazinyl, pyrimidinyl, pyrrolyl, pyrazolyl, imidazolyl, thiazolyl, oxazolyl, isooxazolyl, thiadiazolyl, oxadiazolyl, thiophenyl, furanyl, quinolinyl, isoquinolinyl, and the like, any of which is optionally substituted. In some embodiments, the monomeric species is 3,4-ethylenedioxythiophene.

Examples of oxidizing agents for use in the oCVD processes include, but are not limited to, $CuCl_2$, $FeCl_3$, $FeBr_3$, $I_2$, $POBr_3$, $GeCl_4$, $SbI_3$, $Br_2$, $SbF_5$, $SbCl_5$, $TiCl_4$, $POCl_3$, $SO_2Cl_2$, $CrO_2Cl_2$, $S_2Cl$, $O(CH_3)_3SbCl_6$, $VCl_4$, $VOCl_3$, $BF_3$, $(CH_3(CH_2)_3)_2O.BF_3$, $(C_2H_5)_3O(BF_4)$, or $BF_3.O(C_2H_5)_2$. In one embodiment, the oxidizing agent is $FeCl_3$.

In some embodiments, the cathode buffer material may be formed by techniques other than oCVD. Those of ordinary skill in the art will be aware of other suitable techniques. In some embodiments, the cathode buffer material may be formed using solution deposition techniques, for example, spin coating. In some cases, the cathode buffer material (e.g. comprising a conductive polymer) may be spin-coated on a cathode. In a particular embodiment, a cathode buffer material comprising PEDOT:poly(styrene sulfonate) (PEDOT:PSS) may be spin-coated onto a cathode material (e.g., see the Examples section).

In some embodiments, following formation of the cathode buffer material on the cathode, the cathode buffer material may be associated with, coated with, and/or treated by a secondary material. The secondary material, in some embodiments, may reduce the work function of the cathode buffer material as compared to a similar material which has not been associated with, coated with, or treated by the secondary material. In certain embodiments, the cathode buffer material may be associated with, coated with, and/or treated by one or more secondary material. For example, the cathode buffer material may be treated with a first type of secondary material (e.g., acid, an acidic solution) and a second type of reducing agent (e.g., an alcohol such as methonol). In other embodiments, the cathode buffer material may be associated with, coated with, and/or treated by a single secondary material.

In some embodiments, the secondary material may be a reducing agent, for example, an organic reducing agent. The cathode buffer material may be reduced by exposing the cathode buffer material to a reducing agent thereby forming a reduced cathode buffer material. Those of ordinary skill in the art will be aware of methods and techniques for exposing a cathode buffer material to a reducing agent. Non-limiting examples include solution-based techniques, vapor-based techniques, and vacuum thermal evaporation. Non-limiting examples of reducing agent include alcohols, bases, or water. In some embodiments, the reducing agent is methanol, ethanol, ammonia, or water. In some embodiments, the reducing agent is $Cs_2CO_3$, CsF, $Li_2CO_3$, LiF, KOH, NaOH, or tetrakis(dimethylamino)ethylene. Those of ordinary skill in the art will be aware of other materials which would be suitable for use as a secondary material.

In some embodiments, a cathode buffer material associated with, coated with, and/or treated by a secondary material (e.g., a reducing agent) may have a work function that is about 0.1 eV, or about 0.2 eV, or about 0.3 eV, or about 0.4 eV, or about 0.5 eV, or about 0.6 eV, or about 0.7 eV, or about 0.8 eV, or about 0.9 eV, or about 1 eV, or about 1.5 eV, or more, less than a substantially similar cathode buffer material not associated with, coated with, and/or treated by a secondary material (e.g., a reducing agent). Those of ordinary skill in the art will be aware of methods and techniques for determining the work function of a cathode buffer material, for example, using a scanning kelvin probe (e.g., see the Example section).

In some embodiments, the secondary material may be part of a chemical rinsing step, such as an acid rinsing step. In some embodiments, the rinsing step may comprise exposing (e.g., rinsing) the cathode buffer material (e.g., via immersion) to at least one acidic solution. In some instances, the cathode buffer material may be exposed to a single acidic solution and in other instances, the cathode buffer material may be exposed to more than one acidic solution. In certain cases, the cathode buffer material may be exposed to at least one acidic solution and at least one non-acidic solution (e.g. methanol). In embodiments, in which more than one rinse solution is used (e.g., acidic solution followed by methanol), the cathode buffer material may be dried between exposures. In other cases, the cathode buffer material may not be dried between exposures.

Those of ordinary skill in the art will be able to determine suitable parameters (e.g., concentration, temperature, time) for exposing the cathode buffer material to an acid or other secondary material. In general, the rinse time, rinse solution temperature, and solution concentration may be selected as desired for a given application. In some embodiments, the concentration of the acidic solution is between about 0.01 M and about 10 M, or between about 0.01 M and about 8 M, or between about 0.01 M and about 5 M, or between about 0.1 M and about 5 M, or between about 0.5 M and about 5 M, or between about 1 M and about 5 M, or between about 1 M and about 3 M, or between about 1 M and about 2 M. In some embodiments, the temperature that the exposure is conducted at and/or the temperature of the rinse solution is between about 10° C. and about 150° C., or between about 20° C. and about 150° C., or between about 20° C. and about 140° C., or between about 20° C. and about 100° C., or between about 20° C. and about 80° C., or between about 20° C. and about 60° C., or between about 20° C. and about 40° C., or between about 20° C. and about 30° C. In some embodiments, the cathode buffer material is exposed to the acid solution for a period of time between about 0.1 seconds and 100,000 seconds, or between about 0.1 seconds and about 60,000 seconds, or between about 1 seconds and about 60,000 seconds, or between about 10 seconds and about 60,000 seconds, or between about 60 seconds and about 600,000 seconds, or between about 60 seconds and about 60,000 seconds, or between about 60 seconds and about 6,000 seconds, or between about 60 seconds and about 1,000 seconds, or between about 60 seconds and about 600 seconds, or between about 100 seconds and about 600 seconds, or between about 300 seconds and about 600 seconds.

In some cases, the cathode buffer material may be rinsed at ambient conditions (e.g., ambient temperature and pressure) with an acidic solution that has a molarity between about 0.001 M and about 5.0 M. In certain cases, the cathode buffer material may be rinsed at temperature between about 20° C. and about 140° C. with an acidic solution that has a molarity between about 0.1 M and about 5 M for between about 1 second to about 6,000 seconds.

Those of ordinary skill in the art will be able to select the appropriate acid solution for a particular application for exposing the cathode buffer material after the oCVD process. For instance, the appropriate acid solution may comprise an acid known to undergo remove oxidants and/or dopant exchange with films. In some cases, the acidic solution may comprise an inorganic acid (e.g., hydrochloric acid, hydrobromic acid, sulfuric acid, hydroiodic, nitric acid, hypochlorous acid, chloric acid, perchloric acid, phosphoric acid, nitrous acid). In other cases, the acidic solution may comprise an organic acid (e.g., camphor-10-sulfonic acid, acetic acid, formic acid). In some cases, the acid is hydrobromic acid, hydrochloric acid, or sulfuric acid. In certain cases, the acid is camphor-10-sulfonic acid. In some instances, the acid is a strong protic acid (e.g., hydrobromic acid, hydrochloric acid, perchloric acid, sulfuric acid).

In some embodiments, the rinsing step may comprise exposing (e.g., rinsing) the cathode buffer material (e.g., via immersion) to at least one alcohol (e.g., methanol). In some instances, the cathode buffer material may be exposed to a single alcohol and in other instances, the cathode buffer material may be exposed to more than one alcohol. In certain embodiments, the conditions for exposing the alcohol to the cathode buffer material (e.g., rinse temperature, rinse time, alcohol concentration, etc.) may be within the ranges provided for exposure to an acidic solution.

In some embodiments, following exposing the cathode buffer material to a secondary material (e.g., acid, alcohol), may improve the conductivity, ratio of the optical conductivity to the direct current conductivity ($\sigma_{op}/\sigma_{dc}$), sheet resistance, and/or transmittance of the cathode buffer material may improve. For instance, in some embodiments, the increase in conductivity of the cathode buffer material following exposure to a secondary material (e.g., acid) is greater than or equal to about 10%, or about 30%, or about 50%, or about 70%, or about 90%, or about 110%, or about 130%, or about 150%, or about 170%. In some instances, the increase in conductivity of the cathode buffer material following exposure to a secondary material (e.g., acid) is between about 10% and about 200%, or between about 10% and about 170%, or between about 10% and about 150%, or between about 30% and about 150%, or between about 50% and about 150%, or between about 70% and about 150%, or between about 90% and about 150%, or between about 110% and about 150%.

In certain embodiments, the chemical rinse step may increase the ratio of the optical conductivity to the direct current conductivity ($\sigma_{op}/\sigma_{ds}$), and accordingly the transmittance, of the cathode buffer material for a given sheet resistance. In some instances, the increase in the ratio of the optical conductivity to the direct current conductivity of the cathode buffer material following exposure to a secondary material (e.g., acid) is greater than or equal to about 50%, or about 75%, or about 100%, or about 125%, or about 150%, or about 175%, or about 200%, or about 250%. In some instances, the increase in the ratio of the optical conductivity to the direct current conductivity of the cathode buffer material following exposure to a secondary material (e.g., acid) is between about 50% to about 300%, or between about 50% to about 250%, or between about 50% to about 200%, or between about 100% to about 300%, or between about 100% to about 250%, or between about 100% to about 200%. In some cases, rinsing the cathode buffer material with hydrobromic acid may increase the ratio of the optical conductivity to the direct current conductivity from 4 to 12.

In some embodiments, the increase in transmittance at a given wavelength of the cathode buffer material is greater than or equal to about 10%, or about 30%, or about 50%, or about 70%, or about 90%, or about 110%, or about 130%, or about 150%, or about 170% as compared to the transmittance of the first electrode prior to exposure, measured under substantially similar conditions. In some instances, the increase in transmittance of the cathode buffer material following exposure to a secondary material (e.g., acid) is between about 10% and about 200%, or between about 10% and about 170%, or between about 10% and about 150%, or between about 30% and about 150%, or between about 50% and about 150%, or between about 70% and about 150%, or between about 90% and about 150%, or between about 110% and about 150%.

In certain embodiments, the chemical rinse step may decrease the sheet resistance of the cathode buffer material. In some instances, the decrease in sheet resistance following exposure to a secondary material (e.g., acid) is greater than or equal to about 50%, or about 75%, or about 100%, or about 125%, or about 150%, or about 175%, or about 200%, or about 250%. In some instances, the decrease in sheet resistance of the cathode buffer material following exposure to a secondary material (e.g., acid) is between about 50% to about 300%, or between about 50% to about 250%, or between about 50% to about 200%, or between about 100% to about 300%, or between about 100% to about 250%, or between about 100% to about 200%.

In some embodiments, a property of the cathode buffer material may be directly proportional to another property of the cathode buffer material, such that changes in one property may result in changes to another property. For instance, in some embodiments, the transmittance (T) for a given wavelength (e.g., 560 nm), sheet resistance ($R_{sh}$), optical conductivity ($\sigma_{op}$), and direct current conductivity ($\sigma_{ds}$) of the cathode buffer material may be related by the following equation, where $Z_0$ is the impedance of free space (i.e., 377 ohms).

$$T = \left(1 + \frac{Z_0}{2R_{sh}} \frac{\sigma_{op}}{\sigma_{dc}}\right)^{-2}$$

In one example, decreasing sheet resistance of the cathode buffer material may increase the transmittance of the cathode buffer material.

In some embodiments, a method of forming an electromagnetic radiation absorbing and/or emitting device comprises providing a substrate associated with a cathode; and depositing a cathode buffer material on at least a portion of the cathode via oxidative chemical vapor deposition, wherein the cathode buffer material comprises a conductive polymer. In some embodiments, a method of forming an electromagnetic radiation absorbing and/or emitting device comprises providing a substrate associated with a cathode; depositing a cathode buffer material on at least a portion of the cathode, wherein the cathode buffer material comprises a conductive polymer; and exposing the cathode buffer material to a reducing agent, thereby reducing at least a portion of the conductive polymer. In some embodiments, the oxidative chemical vapor deposition comprises providing a vapor-phase monomer species and a vapor-phase oxidizing agent to produce a vapor comprising a conductive polymer precursor; contacting the vapor with the surface of a cathode to form the cathode buffer material.

In some embodiments, the cathode buffer material comprises poly(3,4-ethylenedioxybythiophene) (PEDOT). In a particular embodiment, the cathode buffer material comprises PEDOT:poly(styrene sulfonate) (PEDOT:PSS). In some embodiments, the cathode buffer material comprises reduced poly(3,4-ethylenedioxybythiophene) (PEDOT), wherein at least a portion of the PEDOT has been reduced (e.g., by exposing, treating, or associating the PEDOT with a reducing agent). In some embodiments, the secondary material is $Cs_2CO_3$. In some embodiments, the secondary material is tetrakis(dimethylamino)ethylene.

In some embodiments, an electromagnetic radiation absorbing and/or emitting device is provided comprising poly(3,4-ethylenedioxythiophene) as a cathode buffer layer, wherein poly(3,4-ethylenedioxythiophene) is formed by or formable by oxidative chemical vapor deposition. In some embodiments, a method of forming an electromagnetic radiation absorbing and/or emitting device comprises providing a substrate associated with a cathode, and depositing a cathode buffer layer on at least a portion of the cathode via oxidative chemical vapor deposition, wherein the cathode buffer layer comprises poly(3,4-ethylenedioxythiophene). In some embodiments, the oxidative chemical vapor deposition comprises reacting 3,4-ethylenedioxythiophene monomer and a vapor-phase oxidizing agent to produce a vapor; contacting the vapor with the cathode surface to form poly(3,4-ethylenedioxythiophene) precursor on the cathode.

The cathode buffer material may have any suitable thickness. In some embodiments, the cathode buffer material may be of substantially uniform thickness (e.g., wherein the thickness of the cathode buffer material does not vary more than 10%, or more than 5%, or more than 1% over the surface of the article). The thickness of the cathode buffer material may be between about 1 nm and about 1000 nm, or between about 1 nm and about 500 nm, or between about 1 nm and about 100 nm, or between about 1 nm and about 50 nm, or between about 10 nm and about 100 nm, or between about 10 nm and about 50 nm, or between about 10 nm and about 40 nm. In some embodiments, the thickness of the cathode buffer material may be about 5 nm, about 10 nm, about 15 nm, about 20 nm, about 25 nm, about 30 nm, about 40 nm, about 50 nm, about 60 nm, about 70 nm, about 75 nm, about 80 nm, about 90 nm or about 100 nm.

Methods described herein may be useful in the fabrication of devices, including photovoltaic devices (e.g. solar, cells), light-emitting diodes, or any device including a cathode buffer material. In some embodiments, a method of forming an electromagnetic radiation absorbing and/or emitting device comprises providing a substrate associated with a cathode, and depositing a cathode buffer material on at least a portion of the cathode via oxidative chemical vapor deposition, wherein the cathode buffer material comprises a conductive polymer. In another embodiment, a method of forming an electromagnetic radiation absorbing and/or emitting device, comprises providing a substrate associated with a cathode, depositing a cathode buffer material on at least a portion of the cathode, wherein the cathode buffer material comprises a conductive polymer, and exposing the cathode buffer material to a reducing agent, thereby reducing at least a portion of the conductive polymer Photovoltaic cells will be known to those of ordinary skill in the art. Generally, a photovoltaic cell comprises at least a substrate, an anode, a cathode, a photoactive material disposed between the anode and the cathode, and optionally, a cathode buffer material disposed between the cathode and the photoactive material and/or an anode buffer material disposed between the anode and the photoactive material. The substrate may be associated with the anode or the cathode. The device may be exposed to electromagnetic radiation through the substrate (e.g., convention photovoltaic cell) or via the electrode which is not associated with the substrate (e.g., inverted photovoltaic cell). Photovoltaic cells, components, orientations, and methods of use will be known to those of ordinary skill in the art.

In some embodiments, a device is provided comprising a substrate, a cathode, a cathode buffer material, a photoactive material, an optionally present anode buffer material, and an anode, wherein the cathode is disposed between the substrate and the cathode buffer material, the cathode buffer material is disposed between the cathode and the photoactive material, the photoactive material is disposed between the cathode buffer material and the optionally present anode buffer material or the anode, and the anode is disposed between the photoactive material or the optionally present anode buffer material and the substrate. In some cases, the photoactive material comprises an electron-accepting material and an electron-donating material. In some cases, the electron-accepting material is associated with the cathode buffer material and the electron-donating material, and the electron-donating material is associated with the optionally present anode buffer material or the anode and the electron-accepting material.

In some embodiments, the efficiency of the photovoltaic cell is greater than about 2%, or about 2.1%, or about 2.2%, or about 2.3%, or about 2.4%, or about 2.5%, or about 2.6%, or about 2.7%, or about 2.8%, or about 2.9%, or about 3.0%. In some embodiments, the efficiency of the photovoltaic cell is between about 2% and about 10%, or between about 2% and about 9%, or between about 2% and about 7%, or between about 2% and about 6%, or between about 2% and about 5%, or between about 2% and about 4%, or between about 2% and about 3%, or between about 2% and about 2.5%.

Those of ordinary skill in the art will be able to select suitable photoactive materials for use in the devices and methods described herein. In some cases, a photoactive material comprises an electron-donating material and an electron-accepting material. Those of ordinary skill in the art will be able to select suitable electron-donating materials (e.g., p-type materials) and electron-acceptor materials (e.g., n-type materials) for use in the embodiments described herein.

The term "p-type material" is given its ordinary meaning in the art and refers to a material that has more positive carriers (holes) than negative carriers (electrons). In some embodiments, the electron-donating material comprises a phthalocyanine, a merocyanine dye, or an optionally substituted conjugated polymer based on polythiophene. Non-limiting examples of electron-donating materials are tetraphenyldibenzoperiflanthene (DBP), copper phthalocyanine, chloroaluminum phthalocyanine, and tin phthalocyanine. Those of ordinary skill in the art will be able to select suitable p-type materials for use in the devices and methods described herein.

The term "n-type material" is given its ordinary meaning in the art and refers to a material that has more negative carriers (electrons) than positive carriers (holes). Non-limiting examples of n-type materials include aromatic hydrocarbons including fullerenes, inorganic nanoparticles, carbon nanorods, inorganic nanorods, polymers containing moieties capable of accepting electrons or forming stable anions, or combinations thereof. In some embodiments, the n-type material is a fullerene, optionally substituted. As used herein, the term "fullerene" is given its ordinary meaning in the art and refers to a substantially spherical molecule generally comprising a fused network of five-membered and/or six-membered aromatic rings. For example, $C_{60}$ is a fullerene which mimics the shape of a soccer ball. The term fullerene may also include molecules having a shape that is related to a spherical shape, such as an ellipsoid. It should be understood that the fullerene may comprise rings other than six-membered rings. In some embodiments, the fullerene may comprise seven-membered rings, or larger. Fullerenes may include $C_{36}$, $C_{50}$, $C_{60}$, $C_{61}$, $C_{70}$, $C_{76}$, $C_{84}$, and the like. Fullerenes may also comprise individual atoms, ions, and/or nanoparticles in the inner cavity of the fullerene. A non-limiting example of a substituted fullerene which may be used as the n-type material is phenyl-$C_{61}$-butyric acid methyl ester. Non-limiting examples of n-type materials are $C_{60}$, 3,4,9,10-perylene tetracarboxylic bisbenzimidazole, $TiO_2$, and ZnO. Those of ordinary skill in the art will be able to select suitable n-type materials for use in the devices and methods described herein.

In one set of embodiments, the electron-donating material comprises DBP and the electron-accepting material comprises $C_{60}$.

The substrate can be any material capable of supporting the device components described herein. That is, the substrate may be any material to which a material and/or component described herein may adhere. The substrate may be selected to have a thermal coefficient of expansion similar to those of the other components of the device to promote adhesion and prevent separation of the device components at various temperatures. Non-limiting examples of substrates include glass, plastics, metals, polymers, paper, fabric and the like. The surface may include those constructed out of more than one material, including coated surfaces (e.g., indium tin oxide-coated glass). Non-limiting examples of surfaces include paper, ceramics, carbon, fabric, nylon, polyester, polyurethane, polyanhydride, polyorthoester, polyacrylonitrile, polyphenazine, latex, teflon, dacron, acrylate polymer, chlorinated rubber, fluoropolymer, polyamide resin, vinyl resin, Gore-Tex™, Marlex™, expanded polytetrafluoroethylene (e-polythiopheneFE), low density polyethylene (LDPE), high density polyethylene (HDPE), polypropylene (PP), and poly(ethylene terephthalate) (PET). The substrate may be opaque, semi-opaque, semi-transparent, or transparent. In some embodiments, the substrate is flexible. In other embodiments, the substrate is rigid.

In some embodiments, a device may comprise an anode buffer material disposed between the anode and the photoactive material. Those of ordinary skill in the art will be aware of suitable anode buffer materials for use in the methods and devices described herein. In some cases, the anode buffer material comprises a metal oxide. Non-limiting examples of metal oxides include $MoO_3$, $V_2O_5$, and $WO_3$.

Various components of a device, such as the anode, cathode, substrate, anode buffer material, etc., can be fabricated and/or selected by those of ordinary skill in the art from any of a variety of components. Components may be molded, machined, extruded, pressed, isopressed, infiltrated, coated, in green or fired states, or formed by any other suitable technique. Those of ordinary skill in the art are readily aware of techniques for forming components of devices herein. Electromagnetic radiation may be provided to the systems, devices, electrodes, and/or for the methods described herein using any suitable source.

U.S. Provisional Application Ser. No. 61/598,325, filed Feb. 13, 2012, entitled "CATHODE BUFFER MATERIALS AND RELATED DEVICES AND METHODS," by Barr et al., is incorporated herein by reference.

The following examples are intended to illustrate certain embodiments of the present invention, but are not to be construed as limiting and do not exemplify the full scope of the invention.

EXAMPLES AND EMBODIMENTS

Example 1

In this example, vacuum and solution processed versions of poly(3,4-ethylenedioxythiophene) (PEDOT) were used as cathode interlayers in inverted organic photovoltaic cells comprising tetraphenyldibenzoperiflanthene (DBP) as the electron donor and $C_{60}$ as the electron acceptor. Chemical treatment of the as-deposited PEDOT layers with tetrakis (dimethylamino)ethylene (TDAE) or cesium carbonate (Cs2CO3) reduced the work function by up to 0.8 eV. Inserting the PEDOT layers at the ITO cathode resulted in improved electron collection and efficiencies of up to 2.3±0.2%, approaching the 3.2±0.3% of the conventional device, illustrating the potential for efficient polymer cathode materials and inverted device architectures compatible with either solution or vacuum processing.

The use poly(3,4-ethylenedioxythiophene) (PEDOT) deposited by both solution and vacuum deposition methods as a cathode buffer layer in inverted organic solar cells on ITO is described. PEDOT:PSS and vacuum deposited PEDOT treated with TDAE or $Cs_2CO_3$ as cathode interlayers in inverted OPVs on ITO, which demonstrates improved electron collection efficiency compared to devices with no cathode buffer layer.

PEDOT films were deposited onto ITO-coated glass substrates (Kintec Co., sheet resistance=15 Ω/sq) that were first solvent-cleaned and treated with $O_2$-plasma. The vapor deposited PEDOT was deposited in a vacuum chamber using the oxidative chemical vapor deposition process (oCVD), at 0.1 Torr and a substrate temperature of 80° C. via simultaneous exposure to vapors of 3,4-ethylenedioxythiophene monomer (Aldrich 97%, ~5 sccm) and sublimed $FeCl_3$ oxidant (Aldrich) for 2 minutes. The PEDOT:PSS (CLEVIOS™ P VP AI 4083) was filtered (0.45 µm), spin-coated at 4000 rpm for 60 seconds, and annealed at 200° C. for 5 minutes in air. Resulting film thicknesses were ~20 nm for oCVD PEDOT and ~50 nm PEDOT:PSS, measured by profilometer (Tencor P-16). Sets of both PEDOT films where then either (i) treated with liquid TDAE in nitrogen atmosphere for 60 seconds before spinning dry at 5000 rpm and transferring into vacuum or (ii) coated with ~1 nm of $Cs_2CO_3$ via vacuum thermal evaporation. Work function measurements were performed in nitrogen atmosphere with a Scanning Kelvin Probe (SKP5050, KP Technology Ltd.) using a 2 mm gold tip, and were calibrated relative to a gold reference surface assumed to be 5.1 eV, which was measured before and after each sample and was stable over the course of the experiment. Average and standard deviation values were calculated from a scan of 220 points recorded evenly across a 1 cm² surface. OPVs were then fabricated using a bilayer heterojunction structure of $C_{60}$ (Aldrich, sublimed) as the electron acceptor and tetraphenyldibenzoperiflanthene (DBP, Lumtec) as the electron donor, with an $MoO_3$ anode buffer layer and Ag top electrode. The DBP and $C_{60}$ were first purified once by thermal gradient sublimation, and then the OPV layers were sequentially deposited onto the ITO substrates (with and without the various PEDOT buffer layers) by thermal evaporation at <$10^{-6}$ Torr and rates of 0.1 nm s$^{-1}$. Shadow masks were used to define a 1 mm by 1.2 mm active device area. The resulting device structures were ITO, $MoO_3$ (20 nm), DBP (25 nm), $C_{60}$ (40 nm), Ag (conventional orientation) and ITO, (PEDOT), C60 (40 nm), DBP, $MoO_3$ (20 nm), Ag (inverted orientation). Current density-voltage (J-V) characteristics were measured in nitrogen atmosphere under simulated AM1.5G illumination from a 1 kW xenon arc-lamp (Newport 91191). Optical interference modeling was performed using transfer matrix formalism, with exciton diffusion lengths $L_D^{C60}$=20 nm and $L_D^{DBP}$=5-20 nm, and optical constants measured by variable angle spectroscopic ellipsometry (J. A. Woollam M-20005).

FIG. 1(a) shows the change in work function measured for PEDOT:PSS and oCVD PEDOT films on ITO before and after treatment with TDAE and $Cs_2CO_3$. The decrease in work function upon treatment with liquid TDAE was ~0.6 eV with PEDOT:PSS (5.52±0.05 eV to 4.97±0.03 eV) and ~0.8 eV for the oCVD PEDOT (5.35±0.04 eV to 4.53±0.05 eV). The observed decreases in work function are consistent with the trends observed previously for TDAE with PEDOT and ITO, Previous reports for oCVD PEDOT showed that lowering the substrate temperature used during the deposition resulted in a 0.3 eV higher work function; thus, the change here may suggest that the oCVD PEDOT can be modified by over 1 eV through a combination of deposition conditions and chemical treatment. The change in surface work function observed upon evaporation of $Cs_2CO_3$ was ~0.3 eV for both the PEDOT:PSS (5.52±0.05 eV to 5.16±0.04 eV) and oCVD PEDOT (5.35±0.04 eV to 5.03±0.03 eV) films.

Figure 1B:
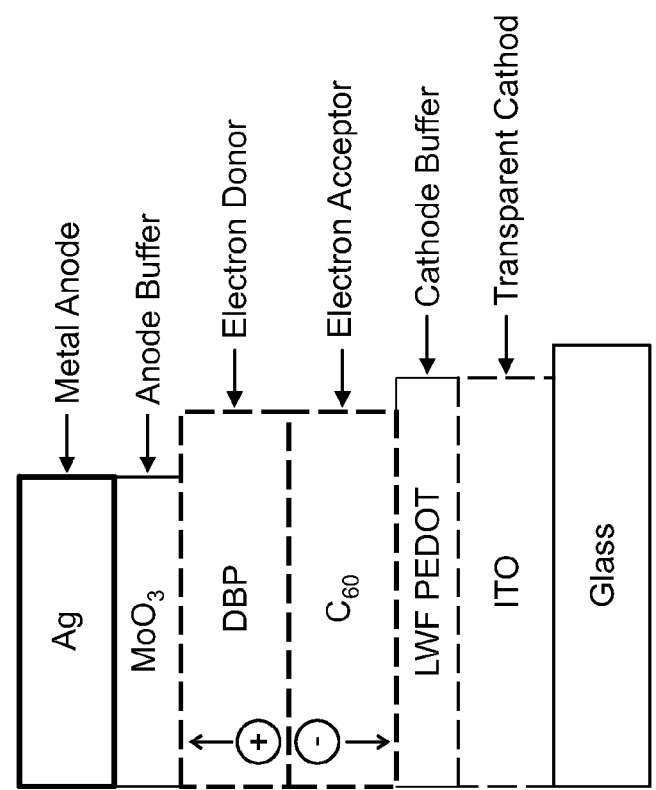
FIG. 1b shows schematic of an inverted device architecture with transparent ITO cathode and a low work function PEDOT buffer layer inserted between an ITO/$C_{60}$ interface, according to some embodiments.
Figure 1C:
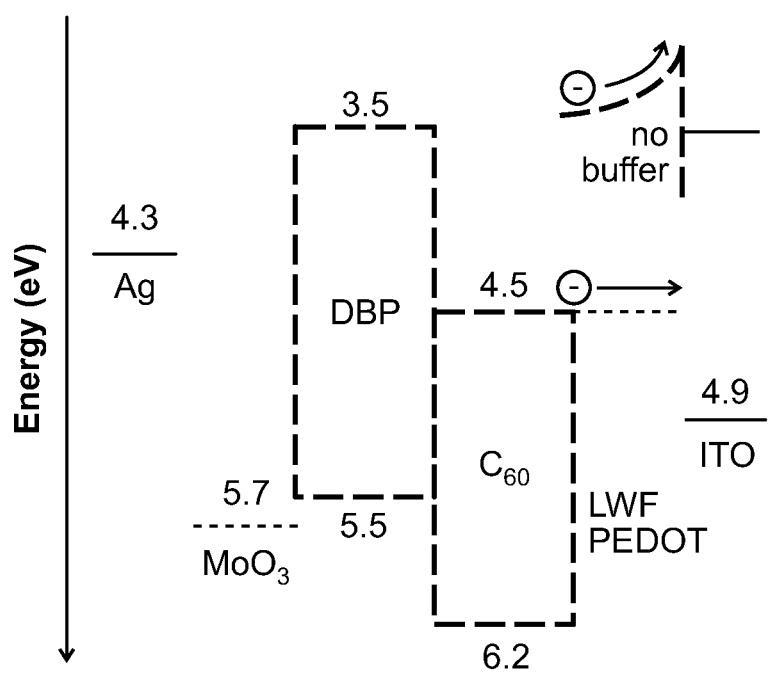
FIG. 1c shows flat band energy level diagram for the inverted device architecture, according to some embodiments. The top-right inset shows a proposed electron-limiting Schottky barrier formed at an unbuffered ITO/$C_{60}$ interface.

FIG. 1(b) shows the schematic of inverted OPVs used in this example, in which the LWF PEDOT layer was inserted between the transparent ITO electrode and the adjacent $C_{60}$ electron acceptor. In the inverted orientation the ITO collected electrons and the Ag collects holes. FIG. 1(c) shows the flat band energy level diagram for the inverted device, with the proposed LWF PEDOT layer raising the ITO cathode work function closer to the lowest unoccupied energy level (LUMO) of the $C_{60}$ layer and the $MoO_3$ layer raising the work function of the Ag anode towards the highest occupied energy level (HOMO) of the DBP layer.

Figure 2A:
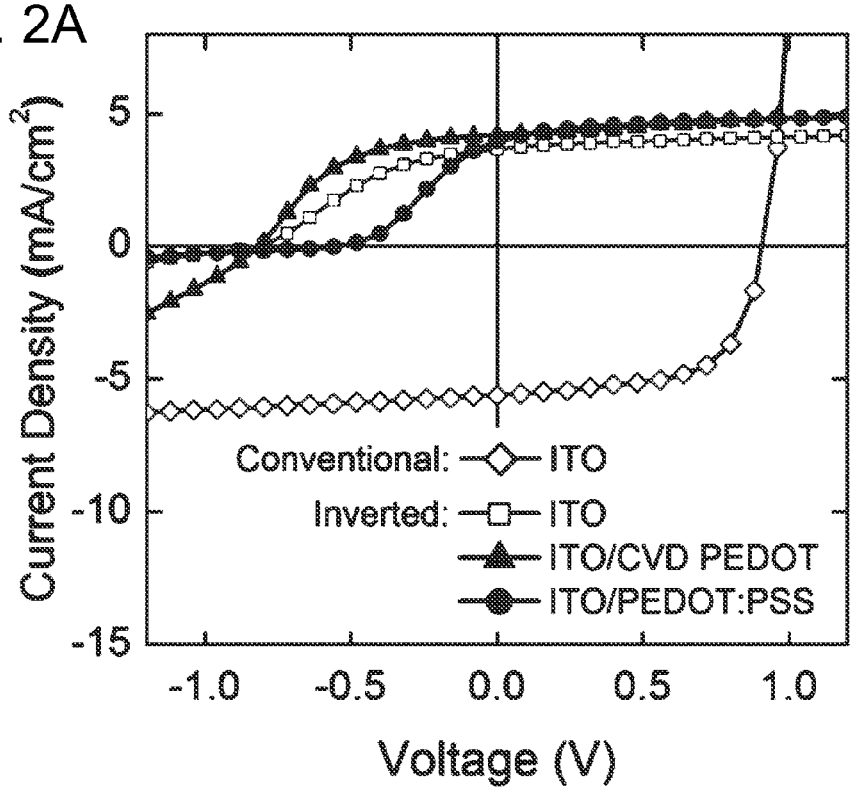
FIG. 2 shows J-V curves under AM1.5G simulated solar illumination for (a) a conventional device orientation (ITO/$MoO_3$ 20 nm/DBP 25 nm/C60 40 nm/Ag) (open diamonds) with the same device stack inverted (ITO cathode) with no buffer layer on the ITO (open squares), and with untreated PEDOT layers on the ITO (filled triangles—CVD PEDOT, filled circles—PEDOT:PSS), according to some embodiments; and b) the same inverted device structure as in FIG. 2a incorporating a LWF PEDOT buffer layer on the ITO cathode: CVD PEDOT/TDAE (filled triangles), CVD PEDOT/$Cs_2CO_3$ (open triangles), PEDOT:PSS/TDAE (filled circles), and PEDOT:PSS/$Cs_2CO_3$ (open circles), according to some embodiments.
Figure 2B:
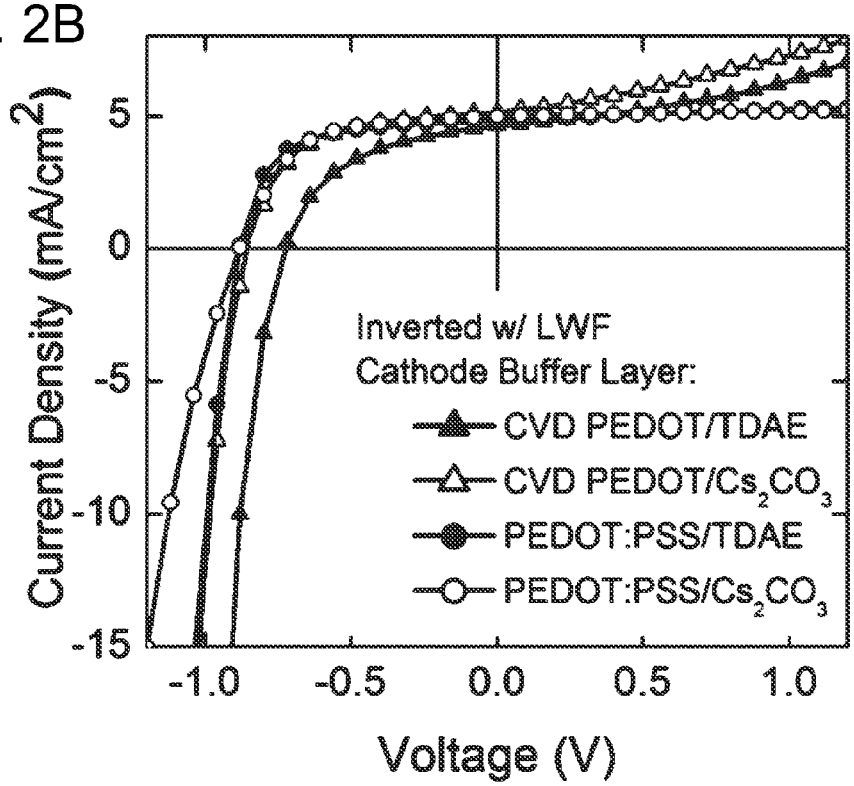

The J-V characteristic of devices with and without the LWF PEDOT buffer layers are shown in FIG. 2. Devices utilizing an unmodified ITO cathode and as-deposited PEDOT cathode layers showed a distinct "S" shape at reverse bias, suggesting the presence of a Schottky junction at the cathode contact in opposition to the diode formed at the DBP/C60 heterojunction interface, which may create a barrier to electron collection (FIG. 1(c), inset). This may be evident in the J-V curve by the poor fill factor (FF) (<0.4) and reduced open-circuit voltage ($V_{oc}$) relative to the conventional device orientation with identical layer thicknesses. Replacing the as-deposited PEDOT layers with the LWF versions (FIG. 2(b)) resulted in improved FF (>0.6) and $V_{oc}$ comparable to the conventional device (0.9 V). This high $V_{oc}$ was supported by sufficient work function offset between the high work function $MoO_3$ layer at the anode and the LWF PEDOT layer at the cathode.

Figure 3:
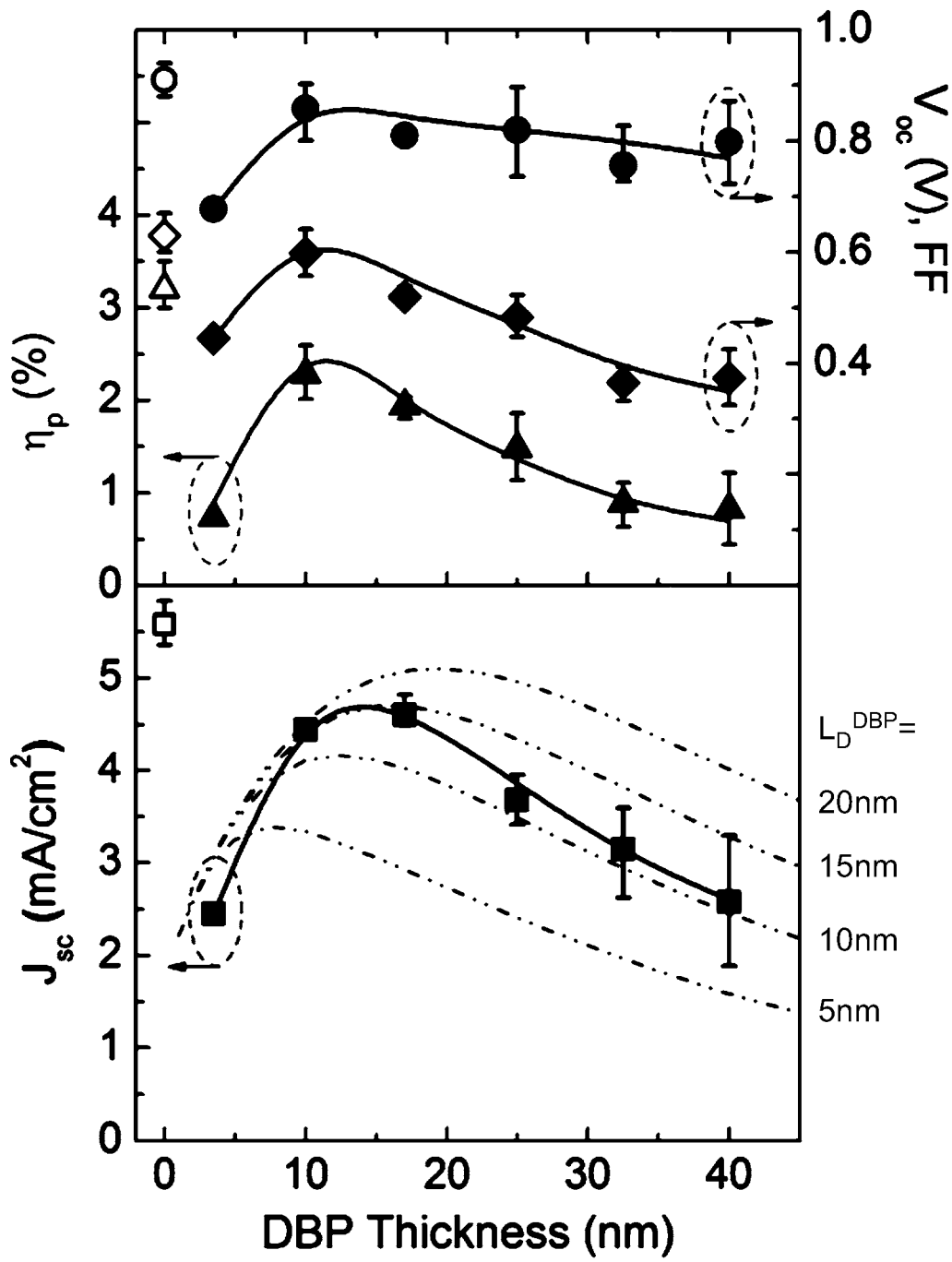
FIG. 3 shows power conversion efficiency, $\eta_p$ (filled triangles), open-circuit voltage (filled circles), fill-factor (filled diamonds), and short-circuit current (filled squares) as a function of DBP electron donor layer thickness for an inverted device with PEDOT:PSS/TDAE buffer layer, according to some embodiments.

The inverted device structure was optimized using the PEDOT:PSS/TDAE cathode buffer layer by varying the DBP thickness (FIG. 3), subsequently moving the position of the reflective Ag interface relative to the DBP/$C_{60}$ interface. The structure was optimized at a DBP thickness of ~10 nm, corresponding to short-circuit current ($J_{sc}$)=4.6 mA/cm², and maxima in $V_{oc}$=0.89 V, FF=0.6, and power efficiency ($\eta_p$)=2.5%. The observed optimum $J_{sc}$ was consistent with simulations modeling the optical interference of light inside the device with light reflected by the Ag anode, and corresponded to a DBP exciton diffusion length ($L_D^{DBP}$)

between 10 and 15 nm (FIG. 3, dashed lines). For this donor/acceptor pair, the optimal photocurrent was lowered for the inverted structure than the conventional structure which may be due to the short wavelength absorber ($C_{60}$, peak <400 nm) positioned farther from the reflective node, while the long wavelength absorber (DBP, peak ~610 nm) was closer to the reflective node, creating a mismatch in the positioning of the peak-wavelength optical electric field maxima within the respective layers. With bulk heterojunction structures, and donor/acceptor pairs with different peak absorption characteristics, higher efficiencies may be possible with such inverted OPVs.

In conclusion, the use of vacuum and solution deposited low work function PEDOT cathode buffer layers was demonstrated. Incorporation of these materials at the cathode in inverted DBP/$C_{60}$ heterojunction OPVs prevented the formation of an electron-limiting Schottky junction at the cathode in opposition to the diode formed by the DBP/$C_{60}$ heterojunction, thereby increasing FF and $V_{oc}$ relative to cells with an improperly or un-buffered cathode interface. An optimal efficiency of 2.5% was observed using an inverted DBP/$C_{60}$ heterojunction structure. This illustrated the potential for efficient polymer cathode materials and inverted device architectures compatible with solution and vacuum processing.

In FIG. 1. (a) Work function of both PEDOT:PSS and CVD PEDOT treated with TDAE or $Cs_2CO_3$. (b) Schematic of the inverted device architecture with transparent ITO cathode and low work function PEDOT buffer layer inserted between ITO/$C_{60}$ interface. (c) Flat band energy level diagram for the inverted device architecture. The top-right inset shows the proposed electron-limiting Schottky barrier formed at an unbuffered ITO/$C_{60}$ interface. Band energies are taken from the literature.

In FIG. 2. J-V curves under AM1.5G simulated solar illumination. (a) Comparison of the conventional device orientation (ITO/$MoO_3$ 20 nm/DBP 25 nm/C60 40 nm/Ag) (open diamonds) with the same device stack inverted (ITO cathode) with no buffer layer on the ITO (open squares), and with untreated PEDOT layers on the ITO (filled triangles—CVD PEDOT, filled circles—PEDOT:PSS). (b) The same inverted device structure incorporating a LWF PEDOT buffer layer on the ITO cathode: CVD PEDOT/TDAE (filled triangles), CVD PEDOT/$Cs_2CO_3$ (open triangles), PEDOT:PSS/TDAE (filled circles), and PEDOT:PSS/$Cs_2CO_3$ (open circles).

In FIG. 3, power conversion efficiency, $\eta_p$ (filled triangles), open-circuit voltage (filled circles), fill-factor (filled diamonds), and short-circuit current (filled squares) as a function of the DBP electron donor layer thickness for the inverted device with PEDOT:PSS/TDAE buffer layer. The dashed lines show short-circuit current vs. DBP thickness calculated from optical interference simulations using DBP exciton diffusion lengths from 5-20 nm (as noted). The control cell in the conventional orientation (ITO/$MoO_3$ 20 nm/DBP 25 nm/$C_{60}$ 40 nm/Ag) is included as x=0 for reference (open symbols). Solid lines are to guide the eyes.

Example 2

Abstract: Reduced sheet resistance and longer film stability of oCVD (oxidative chemical vapour deposition) PEDOT films were achieved by including a post-process acid rinse step in the production of the thin films. PEDOT films were rinsed in multiple concentrations of hydrobromic acid, sulfuric acid, and hydrochloric acid to test the effect of acid rinsing on sheet resistance, doping concentration, chemical composition, optical transmittance, and film morphology. XPS, FTIR, Raman spectroscopy, and XRD measurements were taken to determine the morphology and composition of the rinsed films. On average, rinsing films in HCl, HBr, and $H_2SO_4$ produced conductivity increases of 37%, 135%, and 117%, respectively. The dc to optical conductivity ratio, $\sigma_{dc}/\sigma_{op}$, was increased to 6, 12, and 10, for HCl, HBr, and $H_2SO_4$ rinsed films respectively as compared to $\sigma_{dc}/\sigma_{op}=4$ for MeOH rinsed films. This example shows evidence of dopant exchange within the films facilitated by the acid rinsing step, as well as increased removal of residual iron chloride oxidant. Exchanging the chlorine with larger dopant molecules facilitated improved film conductivity stability. The XRD measurements in particular show signs of crystallinity in the PEDOT film after acid rinsing in comparison to an amorphous structure observed before this step. In this example, acid rinsing applied as a post-process step alters thin PEDOT films in ways that enhance their ability to function as electrode materials (e.g., in photovoltaic devices).

Introduction: Acid rinsing was hypothesized to have multiple potential effects on vapor-deposited PEDOT films including fully removing residual reacted and unreacted oxidant from the film, providing a solvating effect allowing dopant ions to be incorporated into the conjugated chain, and lowering film roughness.

Figure 4:
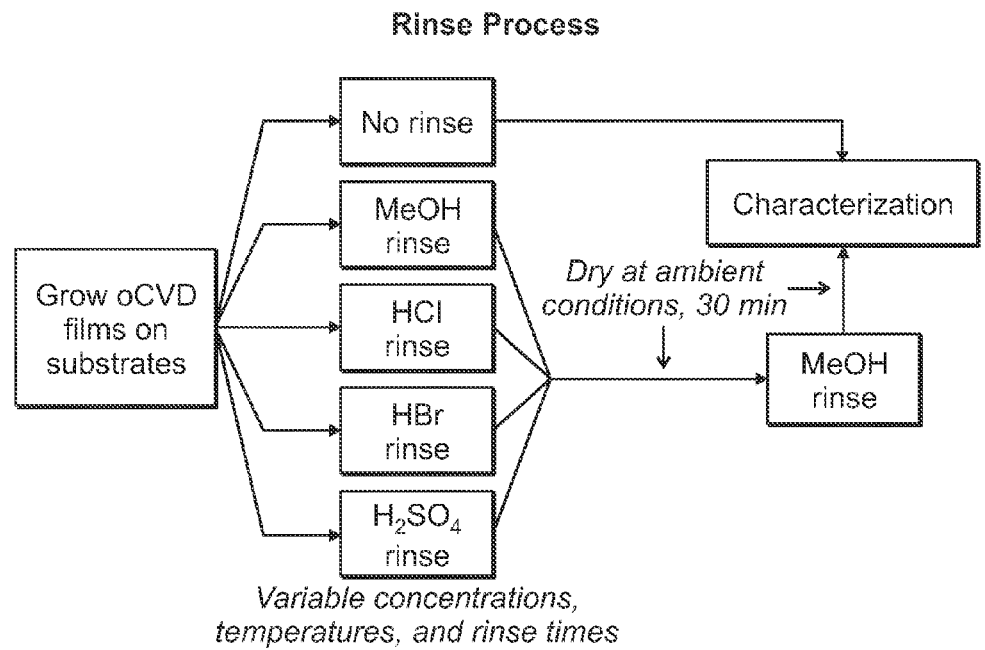
FIG. 4 shows a representive rinsing process after oCVD, according to some embodiments.

Results and Discussion: In this example, the effect of acid rinsing on oCVD PEDOT films was determined. In addition to the determination of acid rinse conditions, XPS, FTIR, UV-Vis spectroscopy, Raman spectroscopy, and XRD measurements were taken to characterize the morphology (e.g., crystallinity, roughness, stability) and composition (e.g., presence or absence of dopant) of the rinsed films. In some embodiments, oCVD PEDOT films that underwent an acid rinsing step before rinsing in methanol (MeOH) were demonstrated. The oCVD PEDOT had reduced sheet resistance of the films (e.g., from 40%-135%) and had longer film stability compared to oCVD PEDOT films that only underwent a methanol rinse step. FIG. 4 shows a schematic of the deposition and rinsing process used to prepare samples for characterization. The PEDOT films were formed using an oCVD process and were doped with a combination of $Cl^-$ and $FeCl_4^-$ anions. After formation, oCVD PEDOT films were rinsed with either an acid or methanol (MeOH), dried, and then rinsed with methanol before characterization. Hydrochloric acid (HCl), hydrobromic acid (HBr), and sulfuric acid ($H_2SO_4$) were selected for investigation since they had anions that have been previously demonstrated as a dopant with PEDOT films. Alternatively, oCVD PEDOT films were characterized after formation without undergoing a rinsing step (NR).

Rinse Conditions: The influence of rinsing with each type of acid on conductivity and sheet resistance was determined. The sheet resistance and conductivity of 20 sets of PEDOT films of varying thickness are shown in Table 1. Average conductivity increases of 37%, 135%, and 117% compared to methanol rinsed films were seen for HCl, HBr, and $H_2SO_4$ rinsed films, respectively. In one embodiment, the maximum observed conductivity was 1620 S cm$^{-1}$.

TABLE 1

Sheet Resistance and Conductivity Data

| | Sheet Resistance (Ω) | | | | | Thickness (nm) | | | | | Conductivity (S/cm) | | | | |
|---|---|---|---|---|---|---|---|---|---|---|---|---|---|---|---|
| Set # | NR | MeOH | HCl | HBr | H2SO4 | NR | MeOH | HCl | HBr | H2SO4 | NR | MeOH | HCl | HBr | H2SO4 |
| 1 | 1260 | 1450 | 1150 | 814 | 923 | 15 | 9 | 10 | 9 | 8 | 529 | 750 | 911 | 1331 | 1282 |
| 2 | 11370 | 14400 | 15780 | 8500 | 10500 | 6 | 4 | 3 | 4 | 3 | 147 | 194 | 190 | 326 | 277 |
| 3 | 10690 | 32100 | 14100 | 10880 | 14020 | 5 | 3 | 3 | 3 | 3 | 187 | 101 | 220 | 280 | 258 |
| 4 | 991 | 1930 | 1300 | 777 | 563 | 18 | 10 | 11 | 11 | 12 | 561 | 496 | 679 | 1162 | 1511 |
| 5 | 929 | 1000 | 1100 | 443 | 441 | 25 | 14 | 16 | 14 | 16 | 431 | 730 | 585 | 1620 | 1425 |
| 6 | 883 | 883 | 693 | 336 | 383 | 33 | 22 | 20 | 21 | 21 | 343 | 523 | 710 | 1389 | 1245 |
| 7 | 186 | 211 | 134 | 85 | 99 | 124 | 78 | 69 | 81 | 79 | 434 | 609 | 1079 | 1456 | 1281 |
| 8 | 307 | 355 | 267 | 103 | 134 | 106 | 69 | 66 | 65 | 62 | 307 | 411 | 564 | 1484 | 1198 |
| 9 | 472 | 453 | 305 | 170 | 200 | 104 | 63 | 63 | 66 | 65 | 204 | 348 | 523 | 888 | 775 |
| 10 | 200 | 224 | 142 | 87 | 93 | 130 | 78 | 81 | 84 | 82 | 385 | 572 | 874 | 1367 | 1309 |
| 11 | 128 | 140 | 88 | 43 | 49 | 235 | 149 | 133 | 155 | 144 | 332 | 478 | 854 | 1502 | 1421 |
| 12 | 200 | 169 | 135 | 67 | 74 | 213 | 129 | 139 | 129 | 133 | 235 | 459 | 533 | 1155 | 1014 |
| 13 | 253 | 306 | 174 | 145 | 144 | 102 | 61 | 59 | 57 | 57 | 388 | 534 | 981 | 1204 | 1224 |
| 14 | 914 | 1100 | 899 | 597 | 603 | 38 | 21 | 24 | 21 | 22 | 288 | 433 | 464 | 816 | 746 |
| 15 | 570 | 556 | 490 | 203 | 227 | 57 | 37 | 37 | 36 | 36 | 308 | 483 | 549 | 1365 | 1228 |
| 16 | 800 | 888 | 722 | 552 | 608 | 39 | 25 | 25 | 24 | 24 | 321 | 455 | 546 | 740 | 676 |
| 17 | 8761 | 9020 | 7325 | 4488 | 5000 | 8 | 5 | 5 | 5 | 5 | 143 | 241 | 267 | 439 | 415 |
| 18 | 13030 | 13239 | 11562 | 7634 | 8059 | 7 | 4 | 4 | 4 | 4 | 110 | 173 | 206 | 299 | 292 |
| 19 | 12489 | 11100 | 8333 | 5884 | 6128 | 10 | 6 | 5 | 6 | 6 | 83 | 144 | 227 | 285 | 277 |
| 20 | 136 | 144 | 107 | 53 | 65 | 197 | 119 | 128 | 119 | 122 | 373 | 584 | 730 | 1590 | 1258 |

Sulfuric acid was used as a representative acid to test the influence of rinsing step parameters. The rinse solution temperature, acid concentration, and rinsing time were varied to determine the influence of these parameters on sheet resistance. In some embodiments, the reduction in sheet resistance observed after performing acid rinsing on the vapor deposited films occurred rapidly and was not significantly dependent on the rinse solution temperature, acid concentration, and/or rinsing time. The rapid reduction of sheet resistance with increasing rinse time and concentration was observed even for thicker films (>100 nm). The speed with which the change occurred and the ability to significantly lower the film sheet resistance even at low acid concentrations (<0.5 mol L$^{-1}$) can be beneficial parameters for a potential scaled up process.

Figure 5:
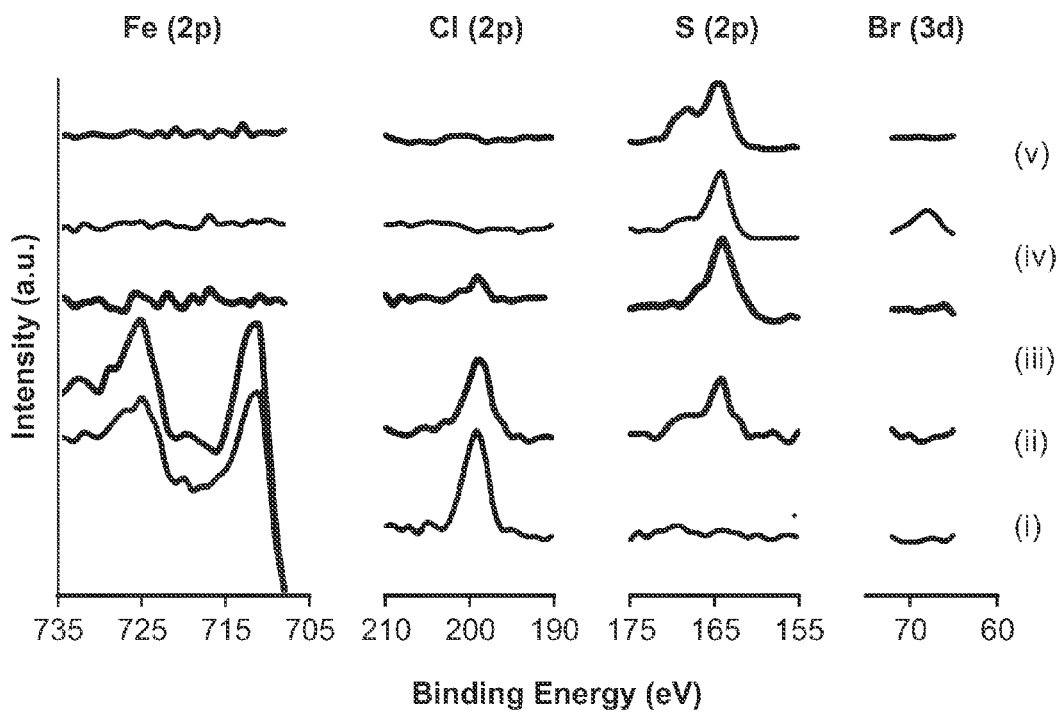
FIG. 5 shows representive X-ray photoelectron spectroscopy survey scans for rinsed oCVD films, according to one set of embodiments.

XPS: X-ray photoelectron spectroscopy (XPS) was used to determine the presence or absence of dopant and the presence or absence dopant exchange in unrinsed films, films rinsed in methanol, and films rinsed in each of the three acid solutions. FIG. 5 shows the X-ray photoelectron spectroscopy survey scan of (i) unrinsed, (ii) MeOH rinsed, (iii) 1 M HCl rinsed, (iv) 1 M HBr rinsed, and (v) 1 M H$_2$SO$_4$ rinsed PEDOT films on glass comparing regions of interest Fe (2p), Cl (2p), S (2p), and Br (3d). The XPS analysis showed that the residual iron chloride was successfully removed for all three acid rinsing treatments, whereas the methanol rinse left a majority of the iron chloride in the film, as indicated by the Fe (2p) peak. The iron chloride may form hydration complexes with water (equation 1) and dissociate (equation 2) (e.g., see G. Hill and J. Holman, *Chemistry in Context*, 5 edn., Nelson Thornes, 2000). The low pH of the acidic solutions may enhance the solubility of ferric materials and provides a stable environment for both +2 and +3 Fe compounds. The removed oxidant compounds could be visually observed in the residual rinsing solution by the yellow color arising from a ligand-to-metal charge-transfer (LMCT) band of FeOH(H$_2$O)$_5^{2+}$.

$$FeCl_3 + 6H_2O \rightarrow Fe(H_2O)_6^{3+} + 3Cl^- \qquad (1)$$

$$Fe(H_2O)_6^{3+} + H_2O \rightarrow FeOH(H_2O)_5^{2+} + H_3O^+ \qquad (2)$$

The XPS analysis also indicated a dopant exchange occurred for the HBr and H$_2$SO$_4$ rinsed films. The intensity of the chlorine peak, Cl (2p), went to zero for the HBr and H$_2$SO$_4$ rinsed films. Additionally, a Br (3d) peak appeared for the HBr rinsed film, and the S (2p) formed a double peak corresponding to sulfate doping for the H$_2$SO$_4$ rinsed film. Without being bound by theory, it is believed that the exchange process may be driven by the excess of the new dopant anion in the rinse solution and the system reaching equilibrium with the doped polymer chains (e.g., equation 3, where EDOT represents a doped monomer unit).

$$H^+Br^- + EDOT^+Cl^- \rightleftharpoons H^+Cl^- + EDOT^+Br^- \qquad (3)$$

An XPS depth profiling of a film rinsed with HBr was also performed. The profile scans showed no presence of iron or chlorine in the rinsed film through the entirety of the film thickness, as the appearance of a Si (2p) peak in the bottom curves indicated that the analysis has reached the substrate surface. The presence of the Br (3d) peak through the film also indicated that the dopant exchange occurred throughout the film. The average atomic % ratio of Br to S throughout the HBr rinsed film was 0.3, which amounted to doping of approximately one in every three monomer units (i.e., the theoretical limit for PEDOT:PSS). Films rinsed in pure DI water did not show an improvement in conductivity and the rinse did not remove the residual oxidant.

Morphology: Atomic force microscopy (AFM) and X-ray diffraction were used to determine the roughness and crystallinity of unrinsed films, films rinsed in methanol, and films rinsed in acid solution. Table 2 shows the average surface roughness (Sa) and root-mean square roughness (Sq) of the films after different rinsing conditions, as measured by AFM.

TABLE 2

AFM Roughness Data

| Rinse condition | Sa (nm) | Sq (nm) |
|---|---|---|
| unrinsed | 56.3 | 77.4 |
| MeOH | 7.38 | 18.1 |

TABLE 2-continued

AFM Roughness Data

| Rinse condition | Sa (nm) | Sq (nm) |
|---|---|---|
| HCl (0.5M) | 4.54 | 5.55 |
| HBr (0.5M) | 2.83 | 3.69 |
| H$_2$SO$_4$ (0.5M) | 3.42 | 5.35 |

The unrinsed film and methanol film had the roughest surfaces, because the films had the largest amount of unreacted oxidant remaining in the film. The acid rinsed films had significantly lower roughness. The film rinsed with HBr had the lowest surface roughness. Low surface roughness may be beneficial for polymer electrode applications, because the devices might be less likely to have issues with defects and short circuiting. X-ray diffraction was performed on films before and after methanol and acid rinsing with 1M MeOH, 1M HCl, 1M HBr, and 1M H$_2$SO$_4$. The MeOH rinsed film was primarily amorphous, while the acid rinsed films showed a larger broad peak at a 2θ of 26.3° (corresponding to the [020] reflection) indicating an increase in the film crystallinity. The increased peak intensity over the broad background signified partial crystallinity where there exist some crystalline regions embedded in an amorphous matrix. The higher degree of crystallinity was an indication of better inter-chain stacking, which should improve charge transport via chain hopping and therefore enhance film conductivity.

FTIR: Fourier transform infrared spectroscopy (FTIR) was performed on films after various rinsing treatments to determine if the changes observed in the PEDOT sheet resistance were due to structural bond changes. The similarity between the resultant films (e.g., unrinsed, rinsed in MeOH, rinsed in 1 M HCl, rinsed in 1 M HBr, and rinsed in 1 M H$_2$SO$_4$) suggested that the changes observed in the PEDOT sheet resistance may be due to dopant and morphology affects rather than significant structural bond changes, such as increased conjugation length.

Figure 6A:
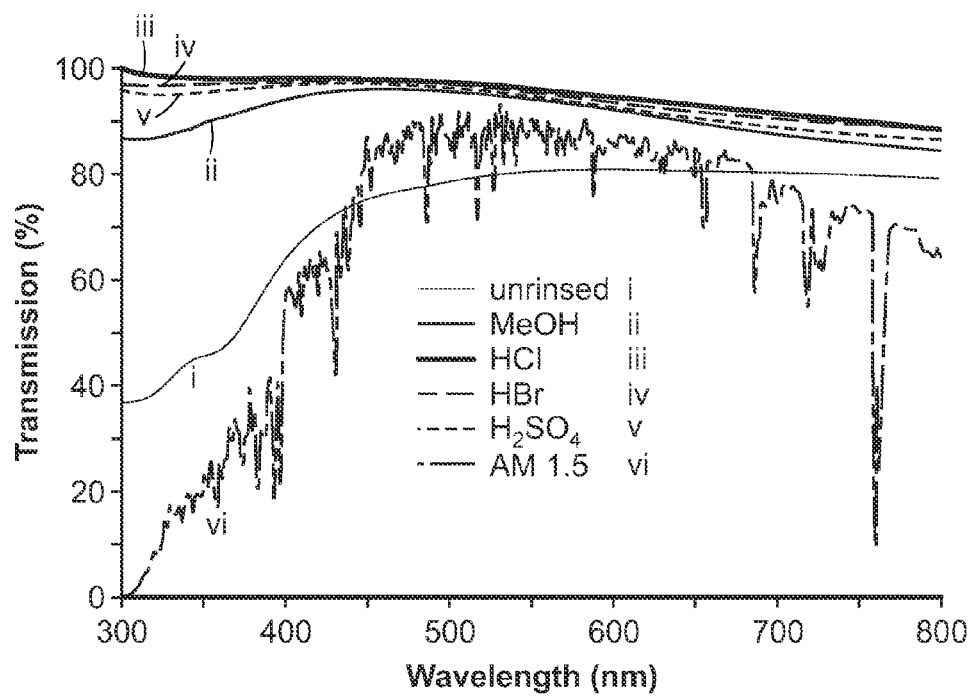
FIG. 6 shows (a) UV-Vis spectra for rinsed oCVD films; and (b) transmittance at 560 nm versus sheet resistance trade-off for rinsed oCVD films (methanol (i), 2 M HCl (ii), 2 M HBr (iii), 2 M H2SO4 (iv)), according to some embodiments.

UV-Vis Spectroscopy: UV-Vis spectroscopy was used to the determine the transmittance of PEDOT films rinsed with MeOH, 2M HCl, 2M HBr, or 2M H$_2$SO$_4$ as well as the tradeoff between transmittance at 560 nm and the sheet resistance. FIG. 6A shows the percent transmittance from 300-800 nm of a 15 nm PEDOT film for each rinsing condition. The black line is for reference and shows the AM1.5 solar spectrum. The unrinsed films, which appeared cloudy over time, had the lowest transmittance while the acid rinsed films had the highest transmittance. The increased transparency of the films after rinsing may be primarily due to the removal of the light-absorbing Fe-species in the residual oxidant.

Figure 6B:
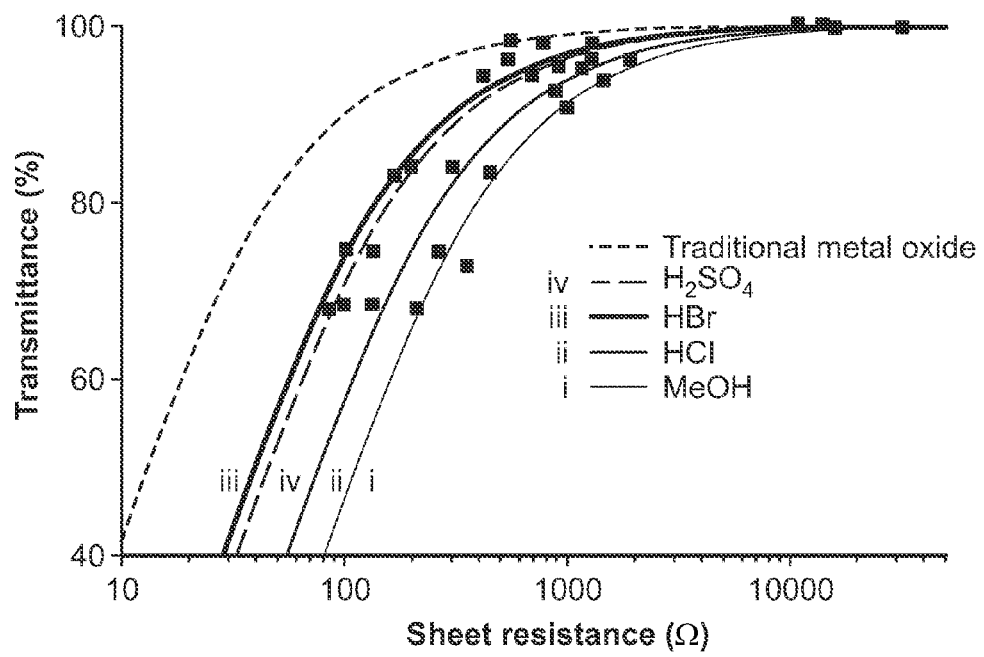

The transmittance at 560 nm was used to determine the balance between transmittance and sheet resistance. FIG. 6B shows the balance between transmittance and sheet resistance for films after different rinsing conditions. In FIG. 6B, the data points represent experimental data and the solid lines are fit to the following equation relating transmittance (T) and sheet resistance (R$_{sh}$):

$$T = \left(1 + \frac{Z_0}{2R_{sh}} \frac{\sigma_{op}}{\sigma_{dc}}\right)^{-2}$$

$Z_0$=377Ω is the impedance of free space and $\sigma_{op}$ and $\sigma_{dc}$ are the optical and dc conductivities, respectively. The dashed black line is representative for traditional metal oxide electrodes, corresponding to $\sigma_{dc}/\sigma_{op}$=35. The standard industry value for transparent oxide conductors, such as indium tin oxide (ITO), is $\sigma_{dc}/\sigma_{op}$>35. With decreasing sheet resistance for approximately the same transmittance values, the $\sigma_{dc}/\sigma_{op}$ value increased from ~4 for the methanol rinsed films to ~6, 10, and 12 for the HCl, H$_2$SO$_4$, and HBr rinsed films, respectively, as shown in FIG. 6B.

Figure 7A:
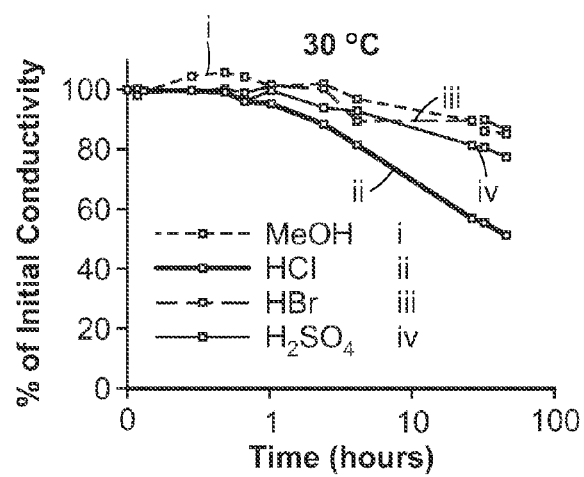
FIG. 7 shows stability of sheet resistance for films after different rinsing conditions at elevated temperatures (a) 30° C. (b) 50° C. (c) 80° C., according to some embodiments.
Figure 7B:
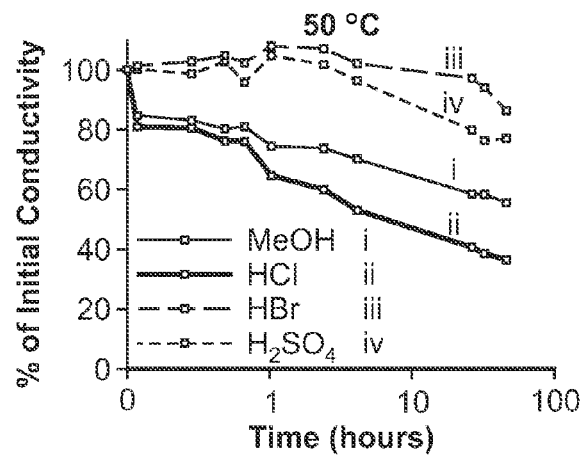
Figure 7C:
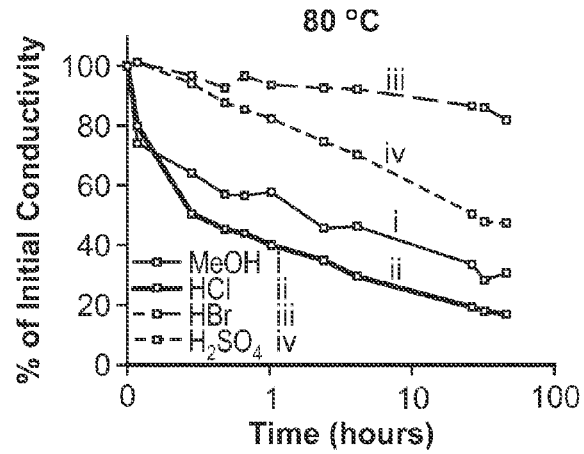

Stability: In some embodiments, another consideration for polymer electrode materials is film stability. To accelerate film degradation, films were heated in air at various temperatures and measured over time for changes in conductivity. FIGS. 7A-C shows the changes in conductivity over a span of 48 hours at 30° C., 50° C., and 80° C. for films following different rinsing conditions.

For each temperature, the HCl rinsed films had the fastest decrease in conductivity, while the HBr and H$_2$SO$_4$ films had the slowest losses. The rate of conductivity loss increased with increasing temperature. The films with the smaller, more volatile dopant (e.g., Cl$^-$) showed a more rapid decrease in conductivity than the films with heavier dopant molecules. Without being bound by theory, it is believed that the size of the dopant molecules may have an impact on conductivity loss over time. Two known mechanisms of PEDOT degradation are exposure to oxygen and water vapor. Shrinking conductive regions with increased heating over time has also been shown as a thermal degradation mechanism for PEDOT:PSS. One non-limiting explanation for the enhanced stability seen for the acid rinsed films may be tighter chain packing, which may provide a better barrier to the atmosphere. The removal of the excess oxidant, which is hygroscopic, may also reduce water content within the films. The size and reactivity of the dopant molecules may play a role in the film degradation and conductivity loss over time as well.

Raman Spectroscopy: Raman spectroscopy was used to determine the degree of doping across films of different rinse conditions after rinsing and after an aging process. FIG. 10A shows the Raman spectra for the films after the different rinsing conditions: MeOH, 1 M HCl, 1 M HBr, and 1 M H$_2$SO$_4$. The intensity of the peak at 1259 cm$^{-1}$, corresponding to $C_\alpha$=$C_{\alpha'}$ inter-ring stretching, was slightly larger for the HBr and H$_2$SO$_4$ rinsed films indicating a quinoid structure. The intensity of the peak height at 1367 cm$^{-1}$, corresponding to $C_\beta$-$C_\beta$ stretching, was lower for the more conductive (HBr and H$_2$SO$_4$ rinsed) films, also suggesting stabilization of the quinoid structure. In the peak at 1420 cm$^{-1}$, corresponding to the symmetric $C_\alpha$=$C_\beta$ stretching band, broadening and right shifting for the films with lower sheet resistance (i.e., the HBr and H$_2$SO$_4$ rinsed films) were observed. The right shift corresponded to a shift toward the doped state of PEDOT, the shift towards higher wave numbers may be explained by a shift toward a higher degree of doping. These fitted peaks showed that the ratio between the doped versus undoped peaks was much larger for the higher conductivity film.

Figure 8A:
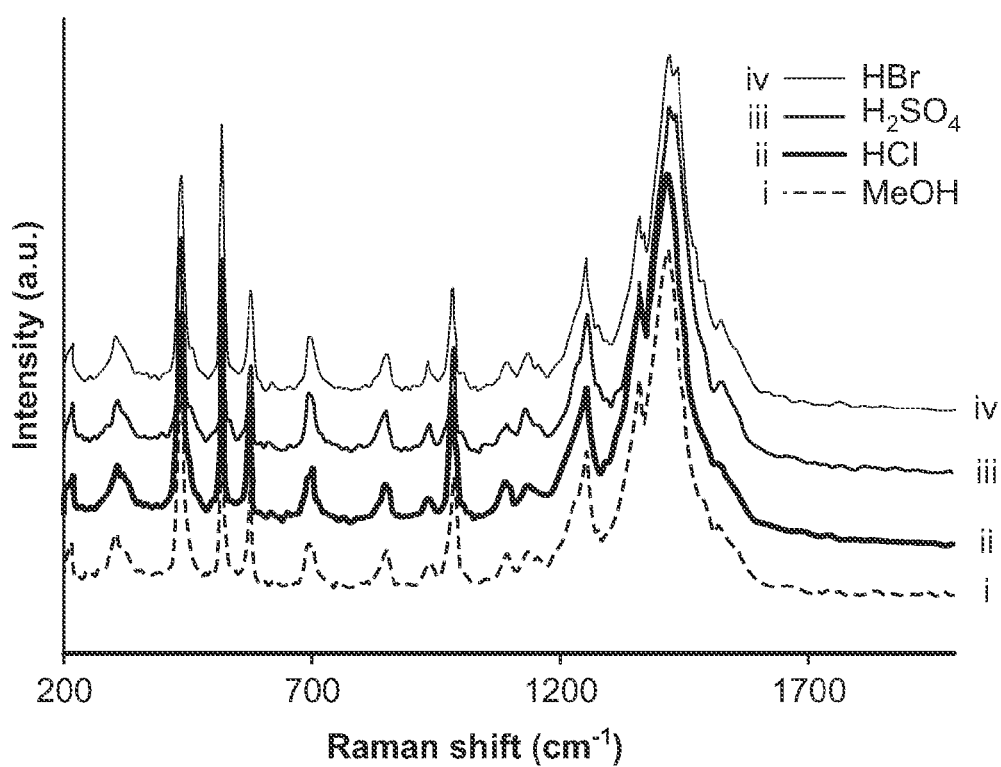
FIG. 8 shows (a) a full raman spectra of oCVD films after different rinsing conditions: (i) MeOH, (ii) 1 M HCl, (iii) 1 M HBr, and (iv) 1 M H2SO4; (b) photographs of patterned oCVD films (i) unrinsed (ii) rinsed in 0.5 M HCl and (iii) rinsed in 0.5 M HCl, according to some embodiments.
Figure 8B:
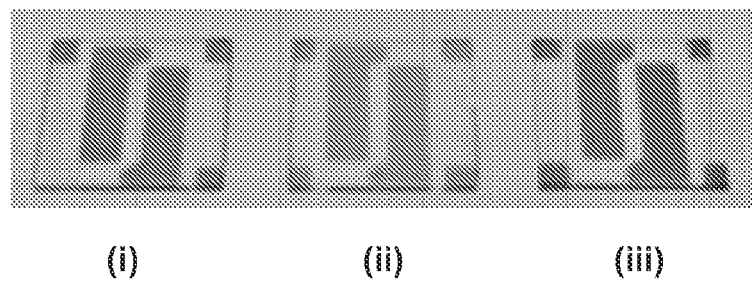

Raman spectroscopy was performed on rinsed films before and after an accelerated aging experiment (e.g., heating at ambient conditions for 100 hours at 100° C.). With the decrease in film conductivity after aging, there was a corresponding left shift in the Raman spectra at the 1420 cm$^{-1}$ $C_\alpha$=$C_\beta$ stretching peak toward the undoped state of PEDOT from the original doped state as shown in FIG. 8A. This shift supported the theory that conductivity degradation during the aging process can be a result of dopant loss. Photographs of thick patterned PEDOT films (i) unrinsed (ii) rinsed in 0.5 M HCl, and (iii) rinsed in 0.5 M HCl and heated for 175 hours at 100° C. are shown in FIG. 8B. A color change (i.e., blue to purple shift) was observed for the film rinsed in HCl, which underwent the largest, most rapid decrease in conductivity. The shift from blue (ii) to purple (iii) was similar to the shift observed when chemically reducing/dedoping PEDOT films.

Conclusion: It was demonstrated that rinsing oCVD polymerized PEDOT films in an acid solution can have many benefits on the film properties including lowering sheet resistance. The residual reacted and unreacted oxidant, $FeCl_3$, was removed from the film which contributed to increased optical transmittance and lower film roughness. A dopant exchange occurred with the acid anions leading to a higher degree of doping and enhanced film stability. These improvements to the film properties may be useful for implementing oCVD polymer layers into optoelectronic device application, amongst other applications.

Experimental:

Film Preparation and Rinsing: Glass and silicon substrates were cleaned by sequential sonication in acetone, deionized water, and isopropyl alcohol, followed by 30 second of oxygen plasma treatment. The PEDOT films were synthesized by oxidative chemical vapour deposition as is known in the art (e.g., see W. E. Tenhaeff and K. K. Gleason, *Advanced Functional Materials*, 2008, 18, 979-992). In short, glass and silicon substrates were simultaneously exposed to vapours of 3,4-ethylenedioxythiophene (EDOT) monomer (Aldrich 97%) metered at ~5 sccm and $FeCl_3$ oxidant (Sigma Aldrich, 99.99%) controllably evaporated from a crucible resistively heated from 100-180° C. at a constant heating rate of 1.5° C. $min^{-1}$. For each comparison across rinsing conditions all samples were used from a single deposition. Process conditions were held the same across all depositions (chamber pressure ~0.1 mTorr, substrate temperature=150° C.). Run time was varied to create films of different thicknesses. Hydrochloric acid (HCl) (Aldrich 37%), hydrobromic acid (HBr) (Aldrich 48%), and sulphuric acid ($H_2SO_4$) (Aldrich 98%) were diluted with deionized $H_2O$ to make rinsing solutions ranging from 0.01-5 mol $L^{-1}$. With the exception of experiments investigating acid rinse concentration and time, films were rinsed for 5 minutes in acid followed by drying for 30 minutes before a final rinse in MeOH. All rinsing and drying steps were done in ambient conditions.

Characterization: XPS and XRD were performed at the Cornell Center for Materials Research (CCMR). XPS depth profiling was done at a speed of ~10 nm $min^{-1}$. UV-Vis was performed using a Cary 5000 over a wavelength range of 200-2000 nm. FTIR was performed on a Nexus 870 FT-IR ESP. Raman spectroscopy was performed on a Horiba HR800 using a 784.399 nm laser. Roughness data was collected using tapping mode AFM (Agilent Technologies) over 1 μm and 10 μm square scans. Film sheet resistance was measured using a Jandel 4-pt probe. Averages were calculated over 10 point measurements. Film thicknesses were measured using a Dektak profilometer. Average values were taken over 10 line scans.

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed:

1. An electromagnetic radiation absorbing and/or emitting device, comprising:
   a conductive polymer as a cathode buffer material, wherein the conductive polymer is formed by oxidative chemical vapor deposition,
   wherein the device comprises a substrate, a cathode, the cathode buffer material, a photoactive material, and an anode
   wherein the cathode is disposed between the substrate and the cathode buffer material, the cathode buffer material is disposed between the cathode buffer material and the anode, and
   wherein the conductive polymer is reduced poly(3,4-ethylenedioxythiophene).

2. The device of claim 1, wherein the photoactive material comprises an electron-accepting material and an electron-donating material.

3. The device of claim 2, wherein the electron-accepting material is disposed between the cathode buffer material and the electron-donating material, and the electron-donating material is disposed between the anode and the electron-accepting material.

4. The device of claim 1, wherein the device is a photovoltaic cell.

5. The device of claim 4, wherein the efficiency of the photovoltaic cell is between about 2% and about 10%.

6. The device of claim 1, wherein the device is an inverted photovoltaic cell.

7. The device of claim 1, further comprising an anode buffer material, wherein the anode buffer material is disposed between the photoactive material and the anode.

8. A method of forming an electromagnetic radiation absorbing and/or emitting device, comprising:
   providing a substrate associated with a cathode;
   depositing a cathode buffer material on at least a portion of the cathode, wherein the cathode buffer material comprises a conductive polymer; and
   exposing the cathode buffer material to a reducing agent, thereby reducing at least a portion of the conductive polymer.

9. The method of claim 8, wherein the cathode buffer material is deposited using oxidative chemical vapor deposition.

10. The method of claim 8, wherein the conductive polymer is poly(3,4-ethylenedioxythiophene).

* * * * *